US012652848B2

(12) United States Patent
Konishi

(10) Patent No.: US 12,652,848 B2
(45) Date of Patent: Jun. 9, 2026

(54) IGBT WITH SHARED EMITTER CONTACT

(71) Applicant: RENESAS ELECTRONICS CORPORATION, Tokyo (JP)

(72) Inventor: Kouichi Konishi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 755 days.

(21) Appl. No.: 18/152,593

(22) Filed: Jan. 10, 2023

(65) Prior Publication Data

US 2023/0335604 A1 Oct. 19, 2023

(30) Foreign Application Priority Data

Apr. 15, 2022 (JP) ................................. 2022-067732

(51) Int. Cl.
| | |
|---|---|
| *H10D 64/23* | (2025.01) |
| *H10D 12/00* | (2025.01) |
| *H10D 12/01* | (2025.01) |

(52) U.S. Cl.
CPC ......... *H10D 64/231* (2025.01); *H10D 12/035* (2025.01); *H10D 12/038* (2025.01); *H10D 12/481* (2025.01)

(58) Field of Classification Search
CPC ......... H10D 12/411–491; H10D 12/00; H10D 64/231; H10D 64/232; H10D 12/035; H10D 62/145; H10D 62/133; H10D 62/393
See application file for complete search history.

(56) References Cited

U.S. PATENT DOCUMENTS

| | | | |
|---|---|---|---|
| 9,041,050 B2 | 5/2015 | Matsuura | |
| 10,505,029 B2 | 12/2019 | Nagata | |
| 2015/0041962 A1* | 2/2015 | Laven | ................. H10D 30/668 |
| | | | 438/513 |
| 2020/0066887 A1 | 2/2020 | Imai | |
| 2020/0212209 A1* | 7/2020 | Nagata | ................. H10D 12/481 |

FOREIGN PATENT DOCUMENTS

| | | |
|---|---|---|
| JP | 2013-140885 A | 7/2013 |
| JP | 2019-029434 A | 2/2019 |
| JP | 2020-31167 A | 2/2020 |

OTHER PUBLICATIONS

Office Action dated Jul. 15, 2025, issued in corresponding Japan Patent Application No. 2022-067732, 14 pages.

* cited by examiner

*Primary Examiner* — Wasiul Haider
(74) *Attorney, Agent, or Firm* — Rimon P.C.

(57) ABSTRACT

A source diffusion layer and a base diffusion layer are formed in regions of a semiconductor substrate located between a trench gate electrode and a trench emitter electrode that are spaced apart from each other. The trench emitter electrode, the base diffusion layer, and an insulating film have a recess that recede from a first main surface toward a second main surface. A shared contact member protrudes from the first main surface toward the second main surface in a manner contacting the recess. According to above structure of a semiconductor device, it is capable of efficiently discharging carriers to an emitter during turn-off.

10 Claims, 31 Drawing Sheets

IGBT WITH SHARED EMITTER CONTACT

CROSS-REFERENCE TO RELATED APPLICATIONS

The disclosure of Japanese Patent Application No. 2022-067732 filed on Apr. 15, 2022, including the specification, drawings and abstract is incorporated herein by reference in its entirety.

BACKGROUND

The present disclosure relates to a semiconductor device and method of manufacturing the same, and more particularly, relates to an injection enhanced type insulated gate bipolar transistor.

In a power semiconductor device, an insulated gate bipolar transistor (IGBT) is provided as a switching device. In addition, an IE effect (effect of electron injection enhancement effect) is also provided in order to lower an on-voltage.

In this type of the semiconductor device, an area is formed to prevent holes injected from the collector side passing through to the emitter (electrode) side. As a result, a concentration of the holes accumulated in a drift layer in the semiconductor substrate increases, and electrons injected from the emitter side is enhanced. Therefore, a concentration of the electrons also increases. As the concentration of carriers (electrons and holes) increases, a conductivity modulation occurs, and the on-voltage can be lowered. In this type of the semiconductor device, various layout patterns of trench gate electrodes and the like have been proposed according to the application as shown in Japanese Patent Laid-Open No. JP-A-2019-29434 (Patent Document 1) and Japanese Patent Laid-Open No. JP-A-2013-140885 (Patent Document 2).

In the semiconductor device, it is required to shorten time until turn-off in order to reduce turn-off loss when switching from an on state to an off state.

That is, it is required to efficiently discharge carriers (holes) accumulated in the drift layer to the emitter (electrode).

Other objects and novel features will become apparent from the description of this specification and the accompanying drawings.

SUMMARY

A semiconductor device according to an embodiment includes an insulated gate bipolar transistor having an emitter electrode, a collector electrode, and a gate electrode, a semiconductor substrate having a first conductivity type, a plurality of trench electrodes, a plurality of impurity regions, an interlayer insulating film, and a plurality of contact members. The semiconductor substrate of the first conductivity type has a first main surface and a second main surface facing each other, and the gate electrode and the emitter electrode are formed on the first main surface, and the collector electrode is formed on the second main surface. The plurality of trench electrodes includes a first trench emitter electrode formed from the first main surface of the semiconductor substrate toward the second main surface and electrically connected to the emitter electrode, and a first trench gate electrode electrically connected to gate electrode. The plurality of impurity regions includes a first impurity region of a second conductivity type having a first impurity concentration, which is formed in a first region of the semiconductor substrate. The interlayer insulating film is formed so as to cover the first main surface of the semiconductor substrate. The plurality of contact members includes a first contact member formed through the interlayer insulating film and electrically connected to the emitter electrode. The first trench emitter electrode is formed via an insulating film in the emitter trench. In a mode in which the first region of the semiconductor substrate contacts the insulating film, the insulating film is interposed between the first region and the first trench emitter electrode. The first impurity region is formed in the first region of the semiconductor substrate at a position where the depth from the first main surface is shallower than a first depth. In the first trench emitter electrode, the insulating film, and the first impurity region, a recess is formed so as to extend between the first trench emitter electrode and the first impurity region and recede from the first main surface toward the second main surface. The recess includes a first portion, a second portion, and a third portion. The first portion is formed in the first impurity region and has a first depth from the first main surface. The second portion is formed in the first trench emitter electrode and has a second depth from the first main surface that is deeper than the first depth. The third portion is formed in the insulating film and has a third depth from the first main surface deeper than the first depth and the second depth and shallower than a fourth depth. The first contact member protrudes from the first main surface toward the second main surface in a manner to be in contact with the recess.

A manufacturing method of a semiconductor device comprising an insulated gate bipolar transistor having an emitter electrode, a collector electrode, and a gate electrode according to another embodiment of the present invention includes a step of providing a semiconductor substrate of a first conductivity type having a first main surface and a second main surface opposed to each other, a step of forming a plurality of trenches, a step of forming a trench electrode in each of the plurality of trenches, a step of forming a plurality of impurity regions, a step of forming a interlayer insulating film so as to cover the first main surface of the semiconductor substrate, a step of forming a plurality of contact openings, a step of forming a contact member in each of the plurality of contact openings, and a step of forming a plurality of conductive layers. Forming the plurality of trenches includes forming first emitter trenches and first gate trenches, respectively, from the first major step toward the second major surface in the semiconductor substrate. The step of forming the plurality of impurity regions includes a step of forming a first impurity region of a second conductivity type in a first region of the semiconductor substrate in contact with an insulating film on a side opposite to the side where a first trench emitter electrode is located with respect to the insulating film. The step of forming the plurality of contact openings includes the step of forming a first contact opening through the interlayer insulating film in a manner that spans the first trench emitter electrode, the insulating film, and the first impurity regions. Forming a contact member in each of the plurality of contact openings includes forming a first contact member in the first contact opening. Forming the plurality of conductive layers includes forming a first conductive layer on the interlayer insulating film, the first conductive layer being electrically connected to the first contact member. In the step of forming the first contact opening, a recess is formed in the first trench emitter electrode, the insulating film, and the first impurity region, the recess being recessed from the first main surface toward the second main surface. In the step of forming the first contact member, the first contact member is formed so as to protrude from the first main surface toward the second main surface in such a manner as to be in contact with the first trench emitter electrode and the first impurity region in which the recess is formed. In the step of forming the first conductive layer, the first conductive layer is formed as an emitter electrode.

According to a semiconductor device of the present embodiments, it is possible to efficiently discharge accumulated carriers to an emitter electrode.

According to a semiconductor device of manufacturing methods according to other embodiments, it is possible to manufacture the semiconductor device capable of efficiently discharge accumulated carriers to an emitter electrode.

BRIEF DESCRIPTION OF THE DRAWINGS

FIG. 4 is a partially enlarged cross-sectional view of a structure of a recess and a shared contact in the first embodiment.

FIG. 11 is a cross-sectional view showing a step performed after the step shown in FIG. 10 in the first embodiment.

FIG. 12 is a cross-sectional view showing a step performed after the step shown in FIG. 11 in the first embodiment.

FIG. 14 is a cross-sectional view showing a step performed after the step shown in FIG. 13 in the first embodiment.

FIG. 15 is a cross-sectional view showing a step performed after the step shown in FIG. 14 in the first embodiment.

FIG. 17 is a cross-sectional view showing a step performed after the step shown in FIGS. 15 and 16 in the first embodiment.

FIG. 18 is a cross-sectional view showing a step performed after the step shown in FIG. 17 in the first embodiment.

FIG. 20 is a partial plan view illustrating an exemplary plane structure of a semiconductor device in a second embodiment.

FIG. 21 is a cross-sectional view showing a cross-sectional structure at each of a line XXIa-XXIa, a line XXIb-XXIb and a line XXIc-XXIc shown in FIG. 20 together in the second embodiment.

FIG. 22 is a partially enlarged cross-sectional view of a structure of a recess and a shared contact in the second embodiment.

FIG. 24 is a cross-sectional view showing a step performed after the step shown in FIG. 23 in the second embodiment.

FIG. 26 is a cross-sectional view showing a step performed after the step shown in FIG. 25 in the second embodiment.

FIG. 27 is a cross-sectional view showing a step performed after the step shown in FIG. 26 in the second embodiment.

FIG. 30 is a cross-sectional view showing a step performed after the step shown in FIG. 29 in the second embodiment.

DETAILED DESCRIPTION

In a power semiconductor device, an insulated gate bipolar transistor (IGBT) is provided as a switching device. In addition, IE effect is also provided in order to lower an on-voltage. In this type of the semiconductor device, various layout patterns of a trench gate electrodes. It has been described that the semiconductor device with an IE type insulated gate bipolar transistor has various layout patterns of the trench gate electrodes and the like depending on an application. For example, in the semiconductor device, which emphasizes on-voltage reduction, there is a GE type semiconductor device. The GE type is a structure in which the trench gate electrode electrically connected to a gate electrode and a trench emitter electrode electrically connected to an emitter electrode are spaced apart from each other.

And other example, there is the semiconductor device which is emphasized on stable and balanced operation. It is a GGEE type semiconductor device. The GGEE type is a structure in which one trench emitter electrode and other trench emitter electrode are spaced apart from each other, and one trench gate electrode and other trench gate electrode are spaced apart from each other. One trench emitter electrode and other trench emitter electrode and the one trench gate electrode and the other trench gate electrode are spaced apart from each other by a predetermined distance.

In addition, yet another example, there is a semiconductor device which is emphasized on high-speed performance. It is a EGE type semiconductor device. The EGE type is a structure in which one trench emitter electrode, one trench gate electrode, and other trench emitter electrode are spaced apart from each other. Hereafter, a concrete description will be given.

Figure 1:
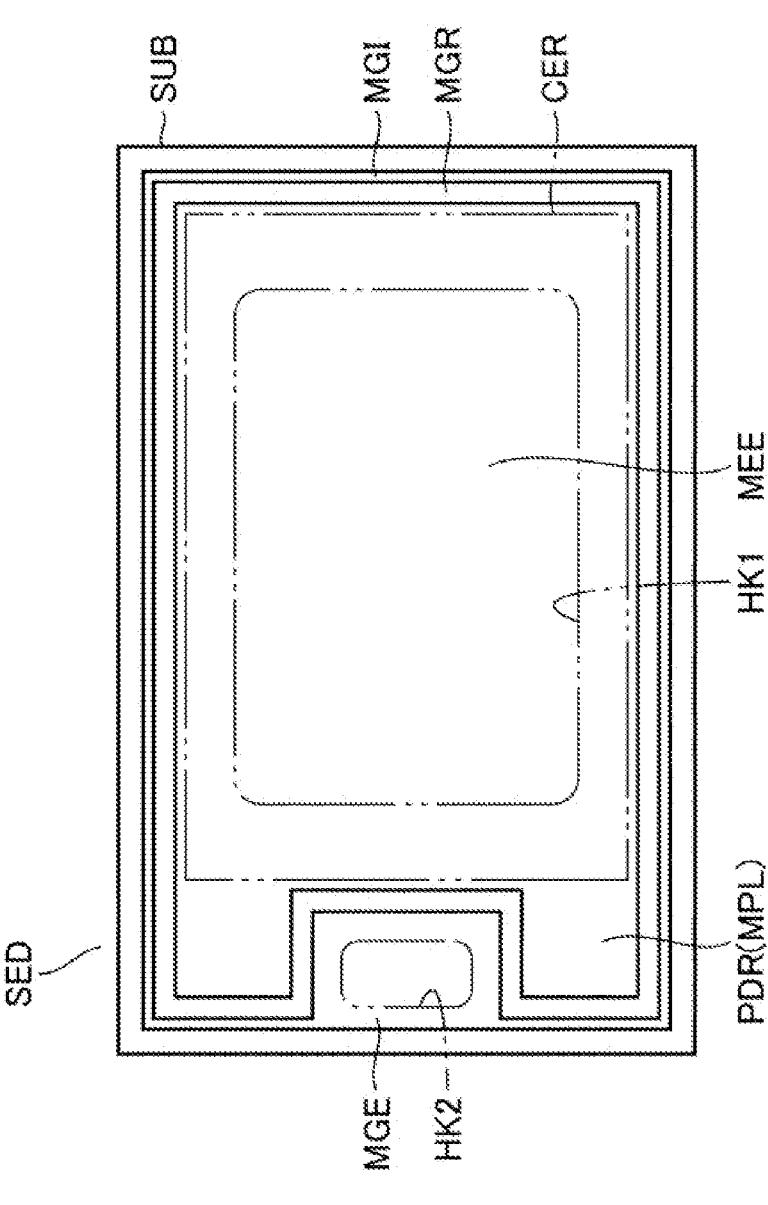
FIG. 1 is a plan view illustrating an exemplary semiconductor device according to each embodiment.

First, an exemplary entire structure of the semiconductor device having an IE insulated gate type bipolar transistor will be described. As shown in FIG. 1, a cell region CER and a gate wiring lead-out region MGR are defined in the semiconductor device SED (semiconductor substrate SUB).

The IE type insulated gate bipolar transistor is formed in the cell region CER. The emitter electrode MEE is formed in the cell region CER so as to cover the cell region CER. The emitter electrode MEE is exposed at a bottom of an opening HK1 formed in an interlayer insulating film (not shown) covering the emitter electrode MEE (semiconductor substrate SUB).

The gate wiring lead-out region MGR is arranged so as to surround the cell region CER. In the gate wiring lead-out region MGR, a gate lead-out wiring MGI and the gate electrode MGE are formed. The gate lead-out wiring MGI is electrically connected to the gate electrode MGE. The gate electrode MGE is exposed at the bottom of an opening HK2 formed in the interlayer insulating film (not shown) covering the gate electrode MGE (semiconductor substrate SUB).

Further, the semiconductor device SED (semiconductor substrate SUB) defines a peripheral element area PDR in which peripheral elements such as a protective diode or a temperature sensing diode are formed.

First Embodiment

Figure 2:
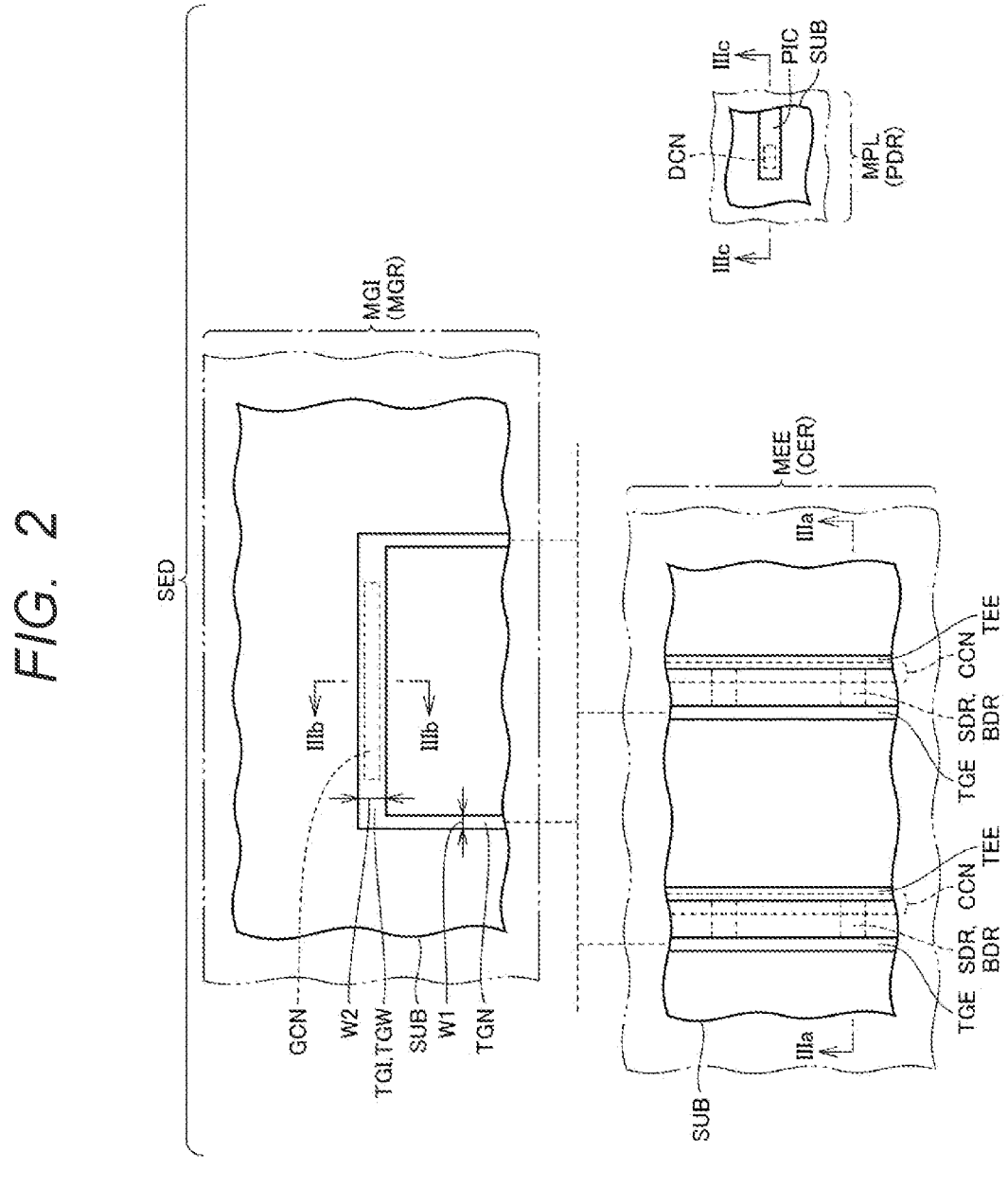
FIG. 2 is a partial plan view illustrating an exemplary plane structure of a semiconductor device in a first embodiment.
Figure 3:
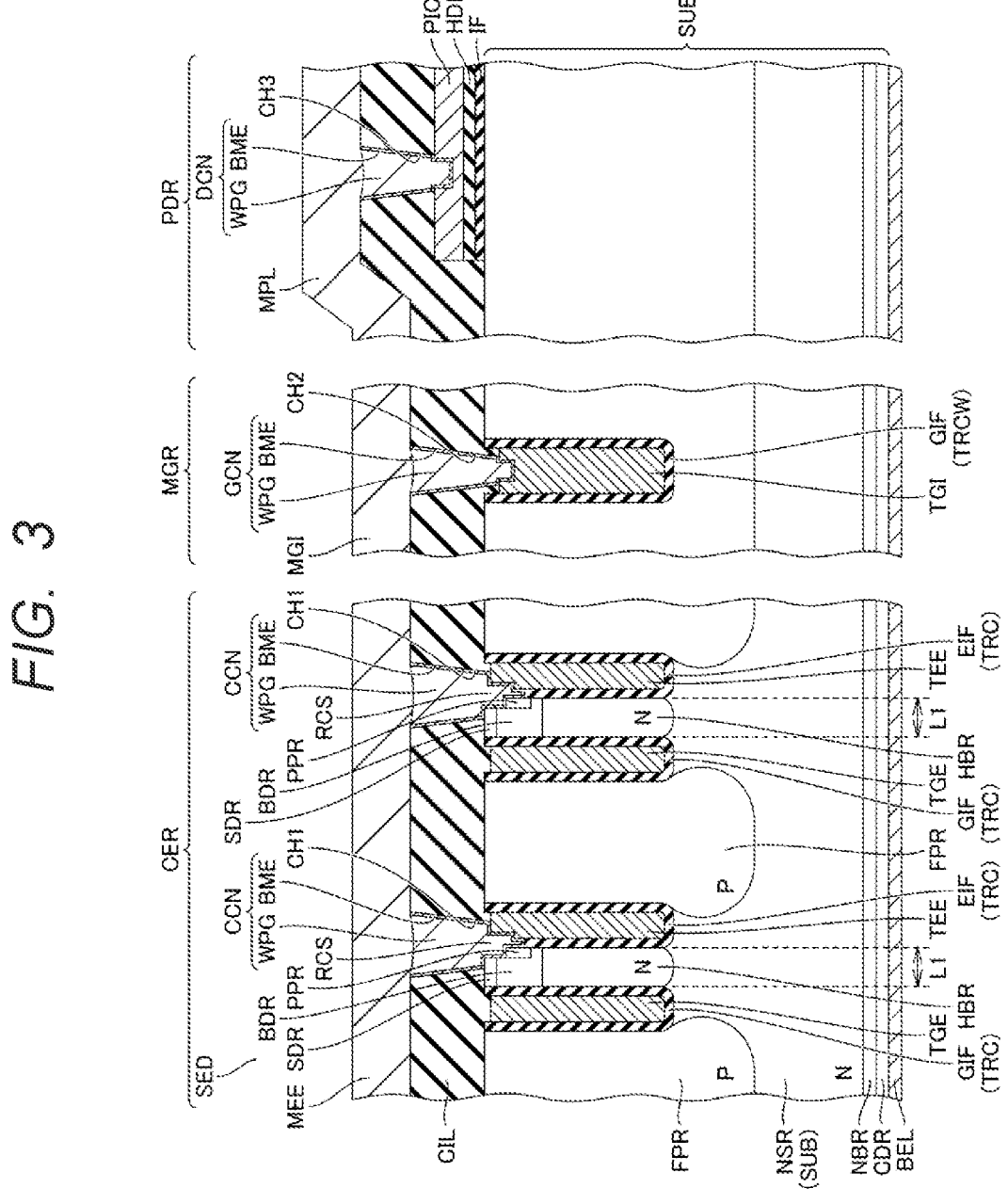
FIG. 3 is a cross-sectional view showing a cross-sectional structure at each of a line IIIa-IIIa, a line IIIb-IIIb and a line IIIc-IIIc shown in FIG. 2 together in the first embodiment.

Here, an exemplary GE type semiconductor device SED will be described. First, a cell region CER will be described. As shown in FIGS. 2 and 3, in the cell region CER, a trench gate electrode TGE (first trench gate electrode) and a trench emitter electrode TEE (first trench emitter electrode) are spaced apart from each other in a first direction. The trench gate electrode TGE and the trench emitter electrode TEE respectively extend in a second direction intersecting the first direction.

The trench emitter electrode TEE is formed via an insulating film EIF (trench insulating film) in a trench TRC (first trench). The trench gate electrode TGE is formed via an insulating film GIF in other trench TRC (second trench). The trenches TRC are formed on a semiconductor substrate SUB having an N-type region NSR (drift layer) from a first main surface toward a second main surface opposite to the first main surface.

In a region (first region) of the semiconductor substrate SUB located between the trench gate electrode TGE and the trench emitter electrode TEE, a source diffusion layer SDR (third impurity region) of N-type is formed over a predetermined depth from the first main surface. A P-type base diffusion layer BDR (first impurity region) is formed from a bottom of the source diffusion layer SDR to a predetermined depth. In the base diffusion layer BDR, a P+ layer PPR (high concentration impurity region, second impurity region) having a higher P-type impurity concentration is formed. an impurity concentration of the second P+ layer PPR is higher than an impurity concentration of the base diffusion layer BDR. An N-type hole barrier layer HBR is formed from a bottom (a fourth depth) of the base diffusion layer BDR to a predetermined depth. The hole barrier layer HBR is formed to reach a bottom (lower end) of the trench gate electrode TGE and the trench emitter electrode TEE. A region in which the hole barrier layer HBR is formed is referred to as an active region.

In the trench gate electrode TGE, a P-type floating diffusion layer FPR is formed from the first main surface to a position deeper than a bottom portion (lower end portion) of the trench gate electrode TGE in a region of the semiconductor substrate SUB that is located on a side opposite to a side where the trench emitter electrode TEE is located. In a region of the semiconductor substrate SUB located on the side opposite to a side where the trench emitter electrode TEE is located with respect to the trench gate electrode TGE, the P-type floating diffusion layer FPR is formed extending from the first main surface to a position deeper than the bottom (lower end) of the trench gate electrode TGE. Further, in a region of the semiconductor substrate SUB located on the side opposite to the side where the trench gate electrode TGE is located with respect to the trench emitter electrode TEE, the P-type floating diffusion layer FPR is formed extending from the first main surface to a position deeper than the bottom (lower end) of the trench emitter electrode TEE. The floating diffusion layer FPR is referred to as an inactive area.

An interlayer insulating film CIL is formed so as to cover the trench gate electrode TGE, the trench emitter electrode TEE, the source diffusion layer SDR, and the like. A shared contact member CCN is formed through the interlayer insulating film CIL and contacts the trench emitter electrode TEE, the base diffusion layer BDR (P+ layer PPR), the source diffusion layer SDR, and the like. The shared contact member CCN includes a barrier metal film BME and a tungsten plug WPG.

A recess RCS recessed on the semiconductor substrate SUB from the first main surface toward the second main surface is formed in the trench emitter electrode TEE and the base diffusion layer BDR. The shared contact member CCN protrudes from the first main surface toward the second main surface in a manner contacting the recess RCS. A space L1 between the trench emitter electrode TEE and the trench gate electrode TGE is set so that the shared contact member CCN does not contact with the trench gate electrode TGE. This structure will be described later.

An emitter electrode MEE (first conductive layer) is formed so as to be contacted with an upper surface of the interlayer insulating film CIL. The shared contact member CCN is electrically connected to the emitter electrode MEE. The emitter electrode MEE is formed of, for example, an aluminum film or the like.

On the other hand, a P-type collector diffusion layer CDR and an N-type buffer layer NBR are formed on the second main surface of the semiconductor substrate SUB. The N-type region NSR as the drift layer is located between the floating diffusion layer FPR and the buffer layer NBR. A collector electrode BEL (bottom surface electrode) is formed so as to be contacted with the collector diffusing layer CDR on the second main surface of the semiconductor substrate SUB.

Next, a gate wiring lead-out region MGR will be described. In the gate wiring lead-out region MGR, a trench gate lead-out electrode TGI (third trench gate electrode) is formed. The trench gate lead-out electrode TGI is formed with the insulating film GIF interposed in a trench TRCW. As shown in FIGS. 2 and 3, the trench gate lead-out electrode TGI is electrically connected to the trench gate electrode TGE. The trench gate lead-out electrode TGI (trench TRCW (third gate trench)) has a first lead-out portion TGN that is set to a first width W1 same as the width of the trench gate electrode TGE (trench TRC), and a second lead-out portion TGW that is set to a second width W2 wider than the first width W1.

A gate lead-out contact member GCN is formed so as to penetrate the interlayer insulating film CIL and contacts the second lead-out portion TGW of the trench gate lead-out electrode TGI. The gate lead-out contact member GCN includes a barrier metal film BME and a tungsten plug WPG. A gate lead-out wiring MGI (second conductive layer) is formed so as to contact an upper surface of the interlayer insulating film CIL. The gate lead-out contact member GCN is electrically connected to the gate lead-out wiring MGI. The gate lead-out wiring MGI is formed of, for example, an aluminum film or the like.

Next, the peripheral element area PDR will be described. In the peripheral element area PDR, a wiring PIC is formed on the first main surface of the semiconductor substrate SUB with an insulating film IF and a silicon oxide film HDL interposed therebetween. The wiring PIC is electrically connected to peripheral elements (not shown), for example, a protective diode or a temperature sensing diode and the like. A contact member DCN is formed through the interlayer insulating film CIL and contacts the wiring PIC. A conductive layer MPL (third conductive layer) electrically connected to the wiring PIC is formed on the interlayer insulating film CIL via the contact member DCN.

Figure 4:
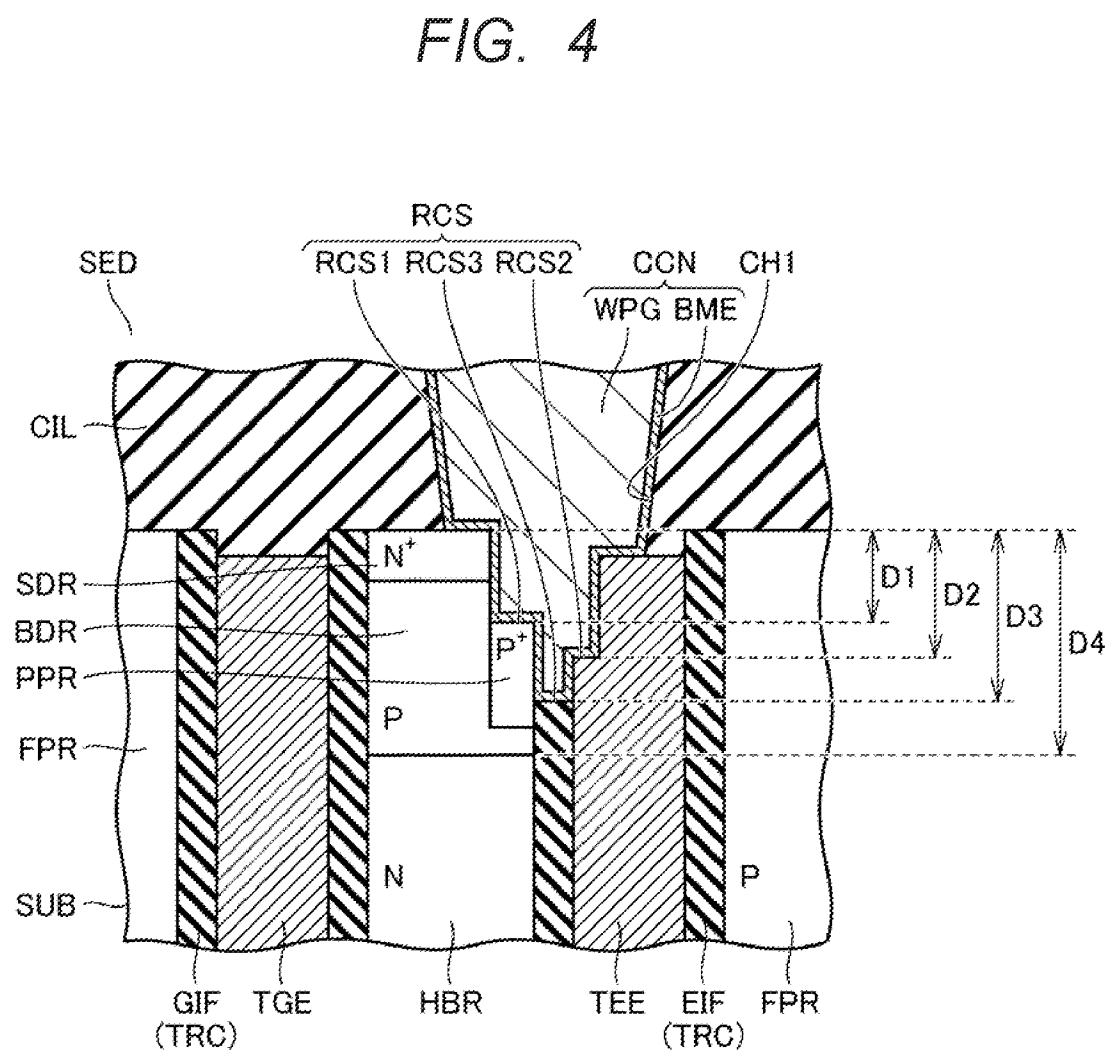

Next, structure of the shared contact member CCN will be described more specifically. As shown in FIG. 4, in the insulating film EIF located between the trench emitter electrode TEE, the base diffusion layer BDR (source diffusion layer SDR), and the trench emitter electrode TEE and the base diffusion layer BDR (source diffusion layer SDR), the recess RCS which is recessed on the semiconductor substrate SUB from the first main surface toward the second main surface are formed.

The recess RCS is formed so as to straddle between the trench emitter electrode TEE and the base diffusion layer BDR (source diffusion layer SDR). The recess RCS includes a first portion RCS1 formed in the base diffusion layer BDR (source diffusion layer SDR), a second portion RCS2 formed in the trench emitter electrode TEE, and a third portion RCS3 formed in the insulating film EIF.

The first portion RCS1 has a first depth D1 from the first main surface. The second portion RCS2 has a second depth D2 from the first main surface deeper than the first depth D1. The third portion RCS3 has a third depth D3 from the first main surface deeper than the first depth D1 and the second depth D2 and shallower than the fourth depth D4 of the base diffusion layer BDR. The shared contact member CCN has a protruding structure on the semiconductor substrate SUB protruding from the first main surface toward the second main surface in a manner contacting the first portion RCS1, the second portion RCS2, and the third portion RCS3.

Since the third depth D3 of the third portion RCS3 formed in the insulating film EIF is deeper than the second depth D2 of the second portion RCS2 formed in the trench emitter electrode TEE, a contact area between the shared contact member CCN and the base diffusion layer BDR (P+ layer PPR) is increased, and carriers (holes) can be efficiently eliminated. The GE type semiconductor device SED is configured as described above.

Figure 5:
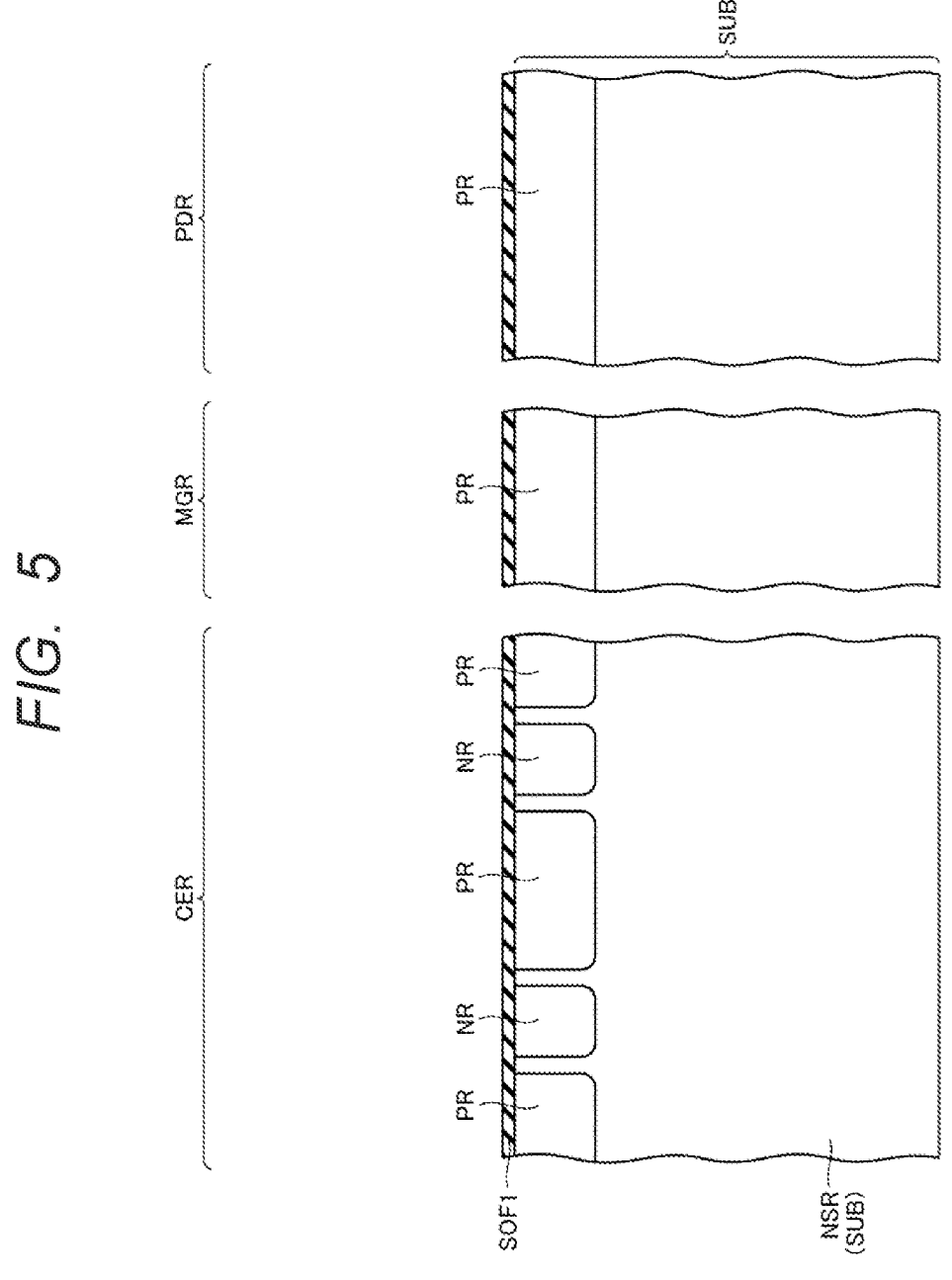
FIG. 5 is a cross-sectional view showing a step of a manufacturing method of a semiconductor device in the first embodiment.

Next, an exemplary manufacturing method of the above-described semiconductor device SED will be described. As shown in FIG. 5, a silicon oxide film SOF1 is formed so as to cover the first main surface of the semiconductor substrate SUB. Next, while the silicon oxide film SOF1 is formed, P-type impurities are implanted to form P-type regions PR to be floating diffusion layer. In addition, N-type regions NR to be hole barrier layer is formed by implanting N-type impurities.

Figure 6:
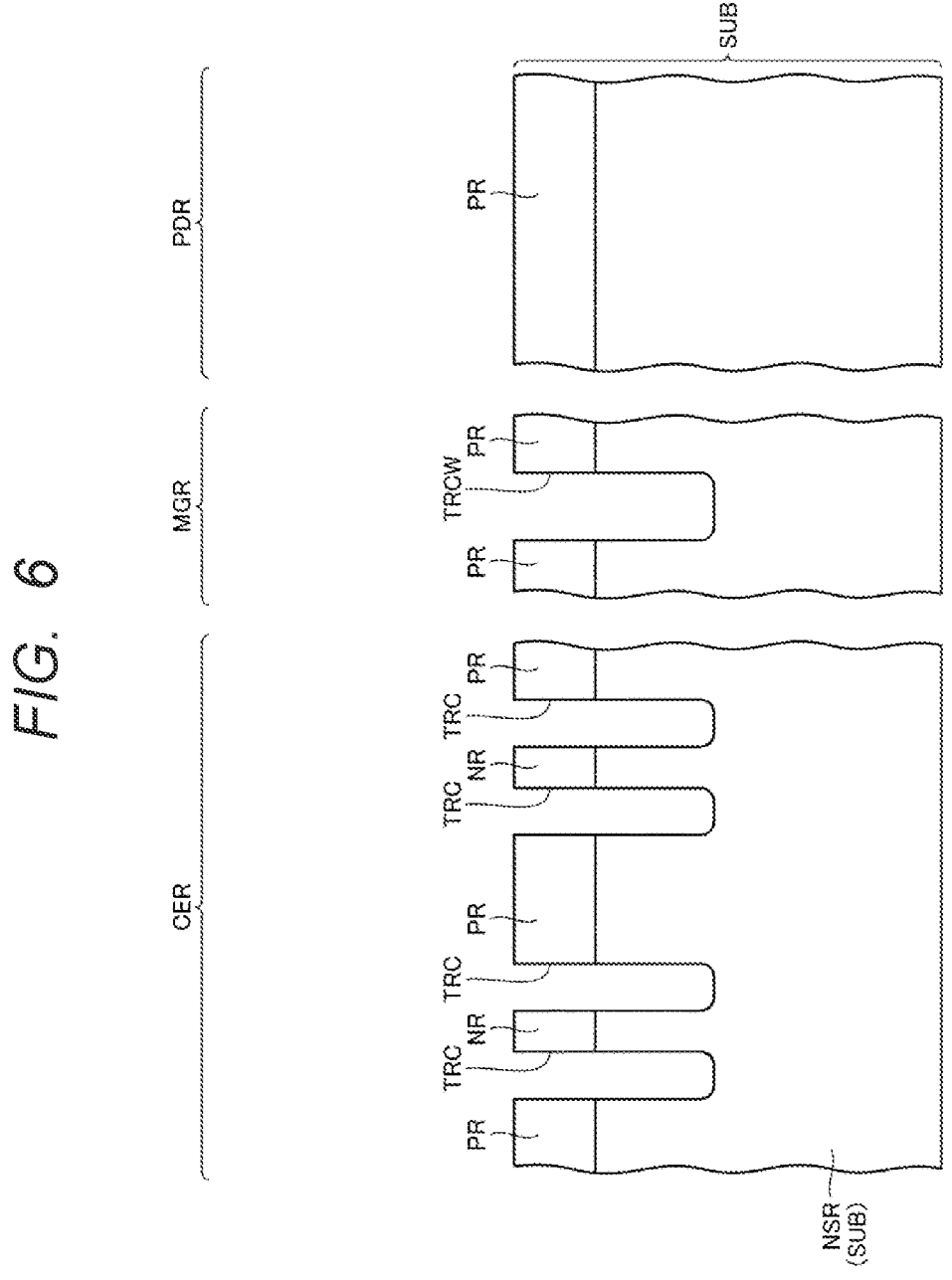
FIG. 6 is a cross-sectional view showing a step performed after the step shown in FIG. 5 in the first embodiment.

A hard mask (not shown) is then formed to form trenches. Next, the semiconductor substrate SUB is performed to an etching process using the hard mask as an etching mask, whereby the trenches TRC (first trench, second trench) and the trench TRCW (third gate trench) are formed (see FIG. 6). Thereafter, the hard mask is removed. As a result, as shown in FIG. 6, the first main surface of the semiconductor substrate SUB in which the trenches TRC and the trench TRCW are formed is exposed. The trench TRCW is formed to have a width larger than the width of the trenches TRC.

Figure 7:
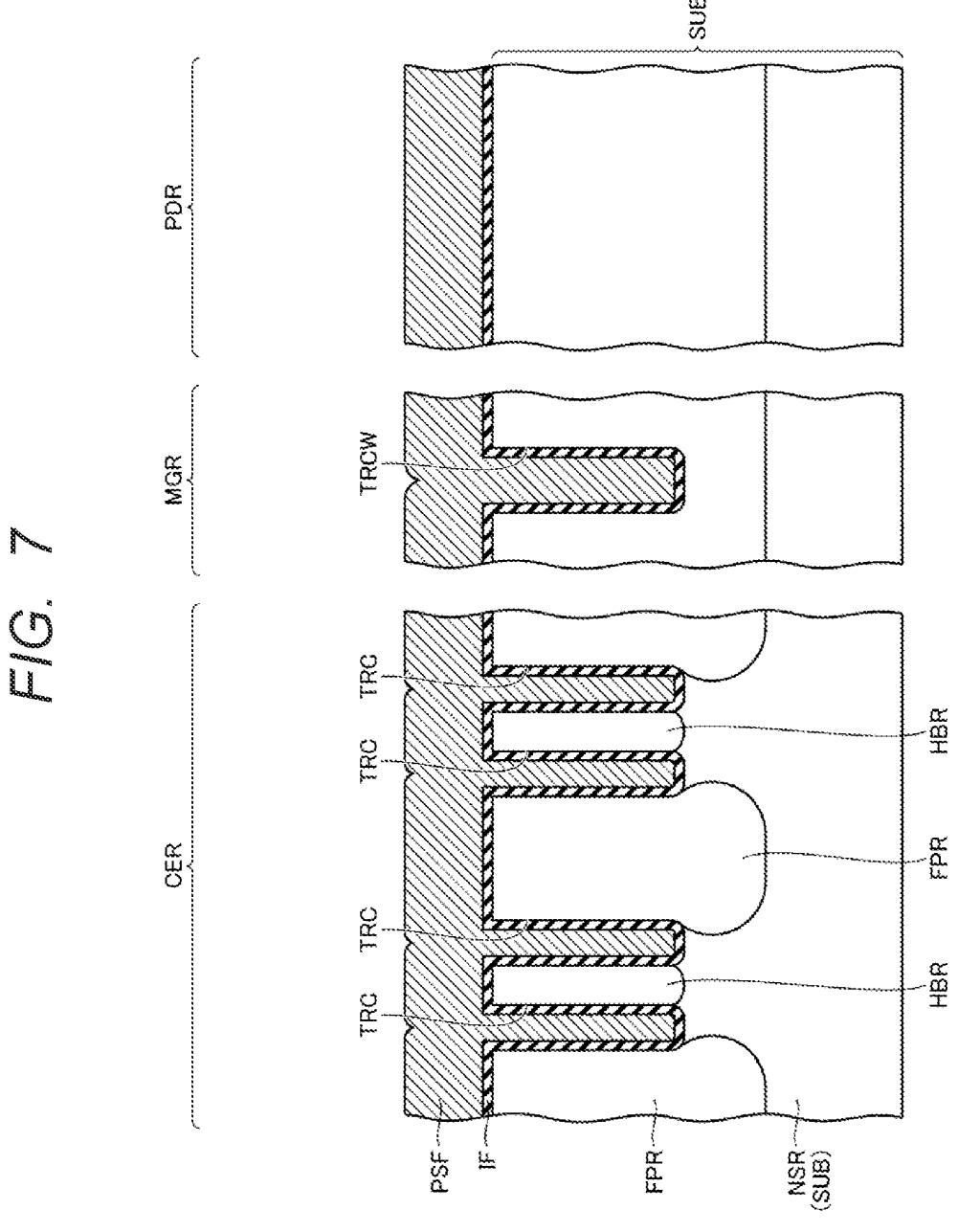
FIG. 7 is a cross-sectional view showing a step performed after the step shown in FIG. 6 in the first embodiment.

Next, a predetermined heat treatment is performed to diffuse the P-type impurities in the P-type regions PR, thereby forming the floating diffusion layer FPR. In addition, the N-type impurities of the N-type regions NR are diffused, so that the hole barrier layer HBR is formed (see FIG. 7). Next, as shown in FIG. 7, the insulating film IF is formed on the first main surface of the semiconductor substrate SUB including inner wall surfaces of the trenches TRC and the trench TRCW by performing a thermal oxidization treatment.

Next, a polysilicon film PSF is formed to cover the semiconductor substrate SUB in such a manner as to fill each of the trenches TRC and the trench TRCW. At this time, a position of the polysilicon film PSF covering the trench TRCW having a relatively large width is lower than a position of the polysilicon film PSF covering the trenches TRC having a relatively small width.

Figure 8:
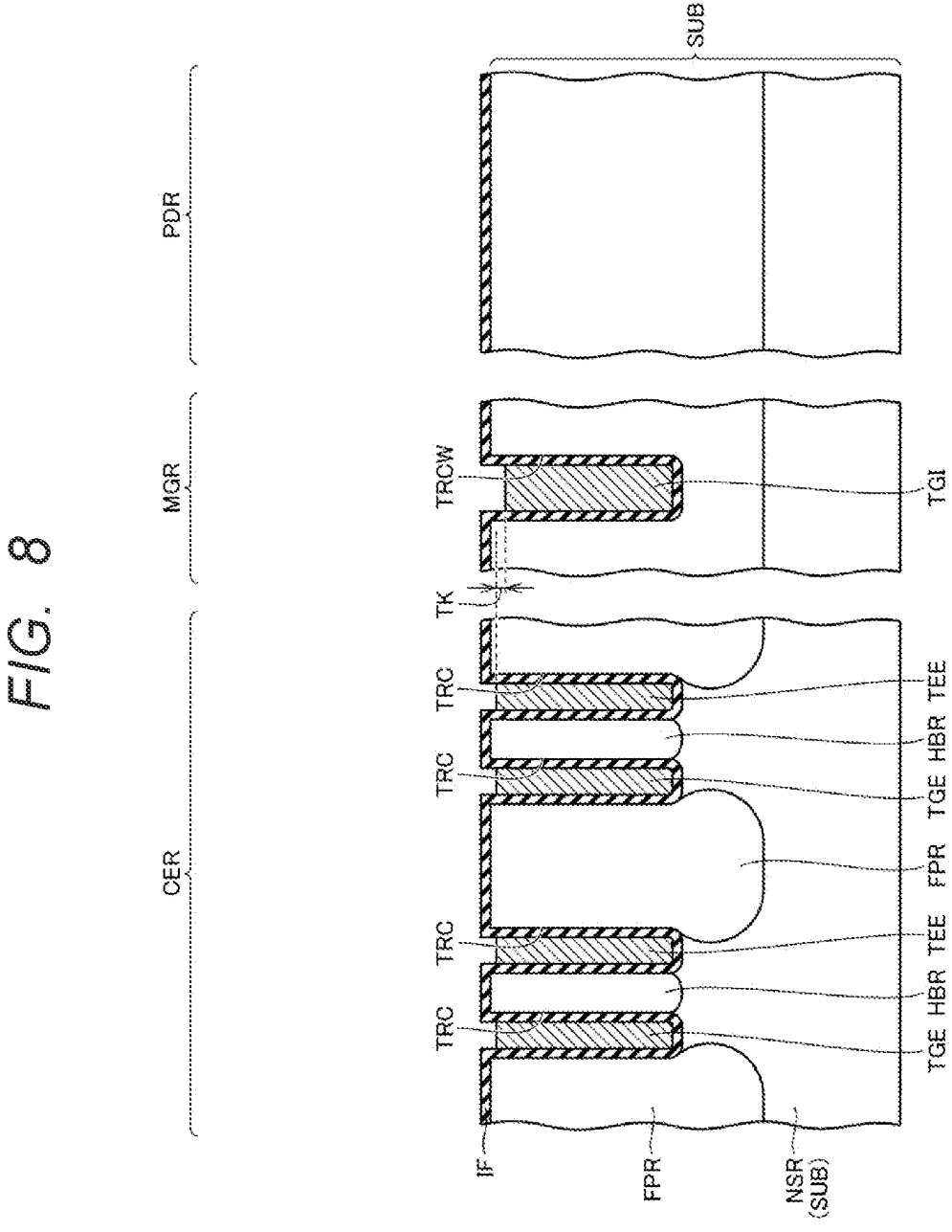
FIG. 8 is a cross-sectional view showing a step performed after the step shown in FIG. 7 in the first embodiment.

Next, an entire surface of the polysilicon film PSF is etched to remove a part of the polysilicon film PSF located on the first main surface of the semiconductor substrate SUB. Further, the polysilicon film PSF is performed to an over etching. As a result, as shown in FIG. 8, an upper surface of the polysilicon film PSF left in each of the trenches TRC and the trench TRCW is lower than the first main surface of the semiconductor substrate SUB.

At this time, with the polysilicon film PSF formed, a state of the polysilicon film PSF covering the trench TRCW is lower than a position of the polysilicon film PSF covering the trenches TRC. Therefore, after the entire etching process is performed, the position of the upper surface of the polysilicon film PSF left in the trench TRCW is lower than the position of the upper surface of the polysilicon film PSF left in the trenches TRC. Here, a thickness corresponding to a difference in height (thickness) is defined as a thickness TK.

Figure 9:
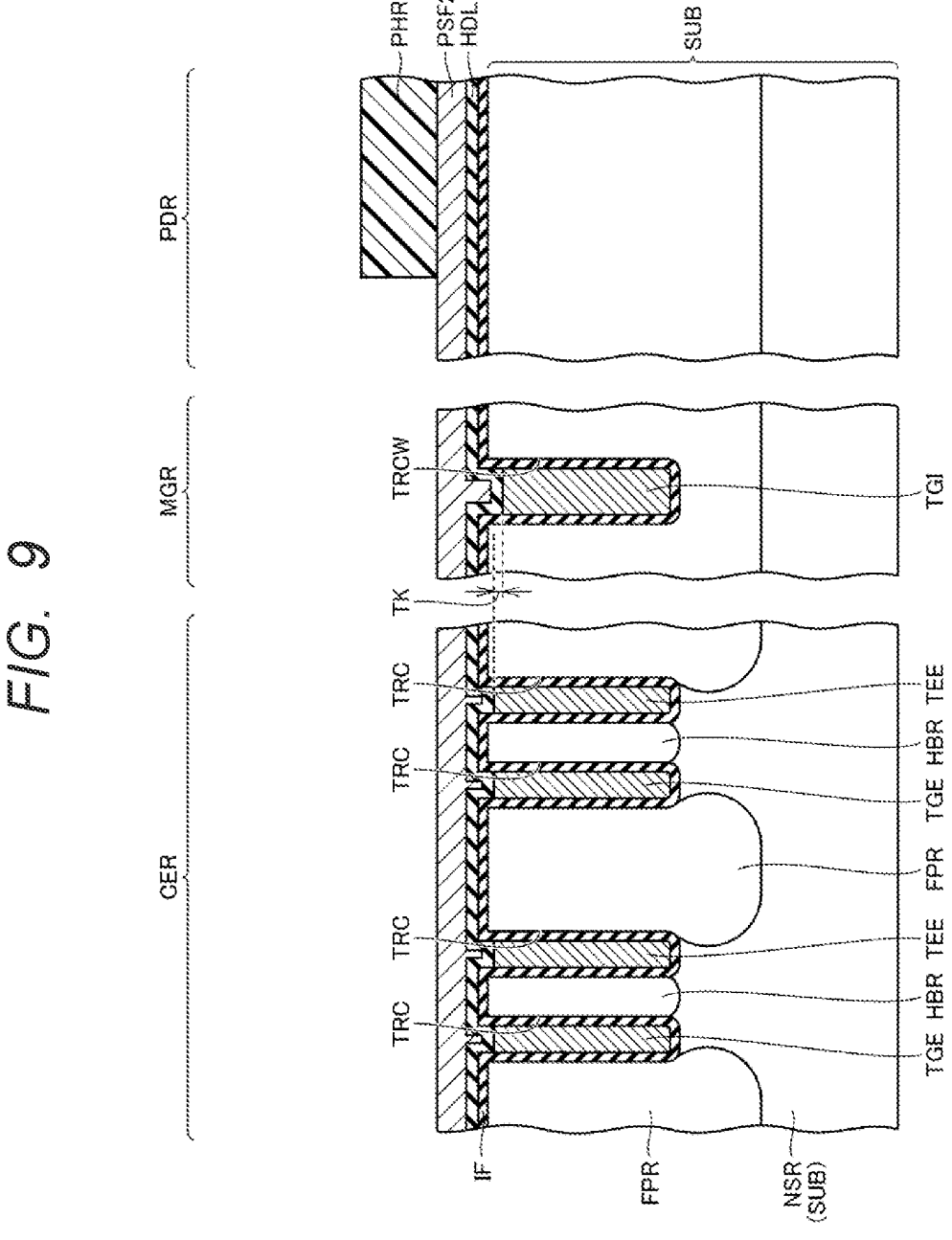
FIG. 9 is a cross-sectional view showing a step performed after the step shown in FIG. 8 in the first embodiment.

Next, as shown in FIG. 9, the silicon oxide film HDL is formed so as to cover the insulating film IF. Next, a polysilicon film PSF2 is formed so as to cover the silicon oxide film HDL. Next, a photoresist pattern PHR1 for patterning wiring is formed by performing a photolithography process.

Figure 10:
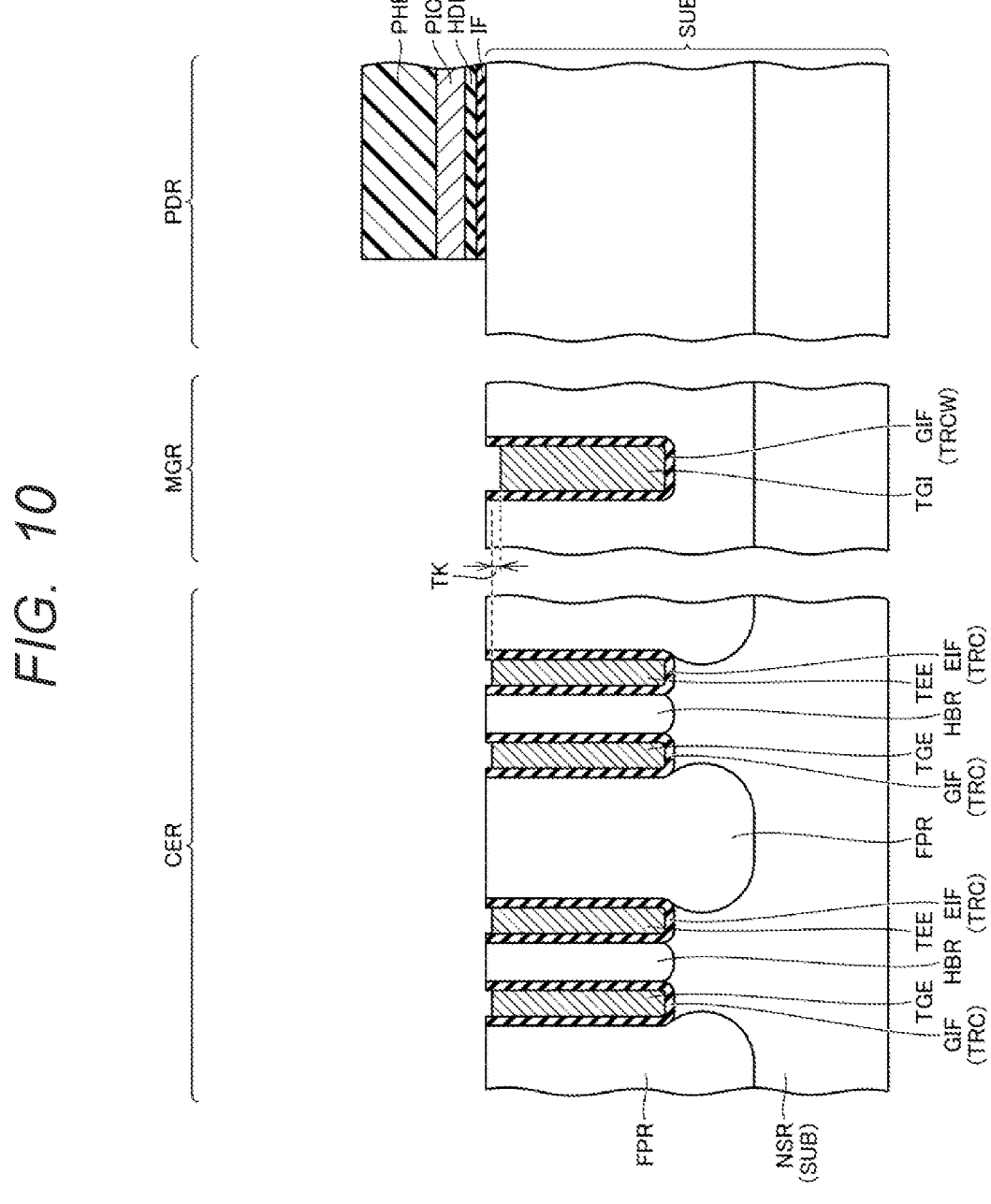
FIG. 10 is a cross-sectional view showing a step performed after the step shown in FIG. 9 in the first embodiment.

Next, as shown in FIG. 10, the wiring PIC is formed by performing an etching process on the polysilicon film PSF2 using the photoresist pattern PHR1 as an etching mask. Next, an etching process is performed on the silicon oxide film HDL using the photoresist pattern PHR1 as an etching mask, and further, an etching process is performed on the insulating film IF to remove a portion of the silicon oxide film HDL located on the first main surface of the semiconductor substrate SUB and a portion of the insulating film IF.

As a result, the trench emitter electrode TEE is formed with the insulating film EIF (insulating film IF) interposed in the trenches TRC. Further, the trench gate electrode TGE is formed via the insulating film GIF (insulating film IF) in the trenches TRC. Further, the trench gate lead-out TGI is formed via the insulating film GIF (insulating film IF) in the trench TRCW. Thereafter, the photoresist pattern PHR1 is removed.

Figure 11:
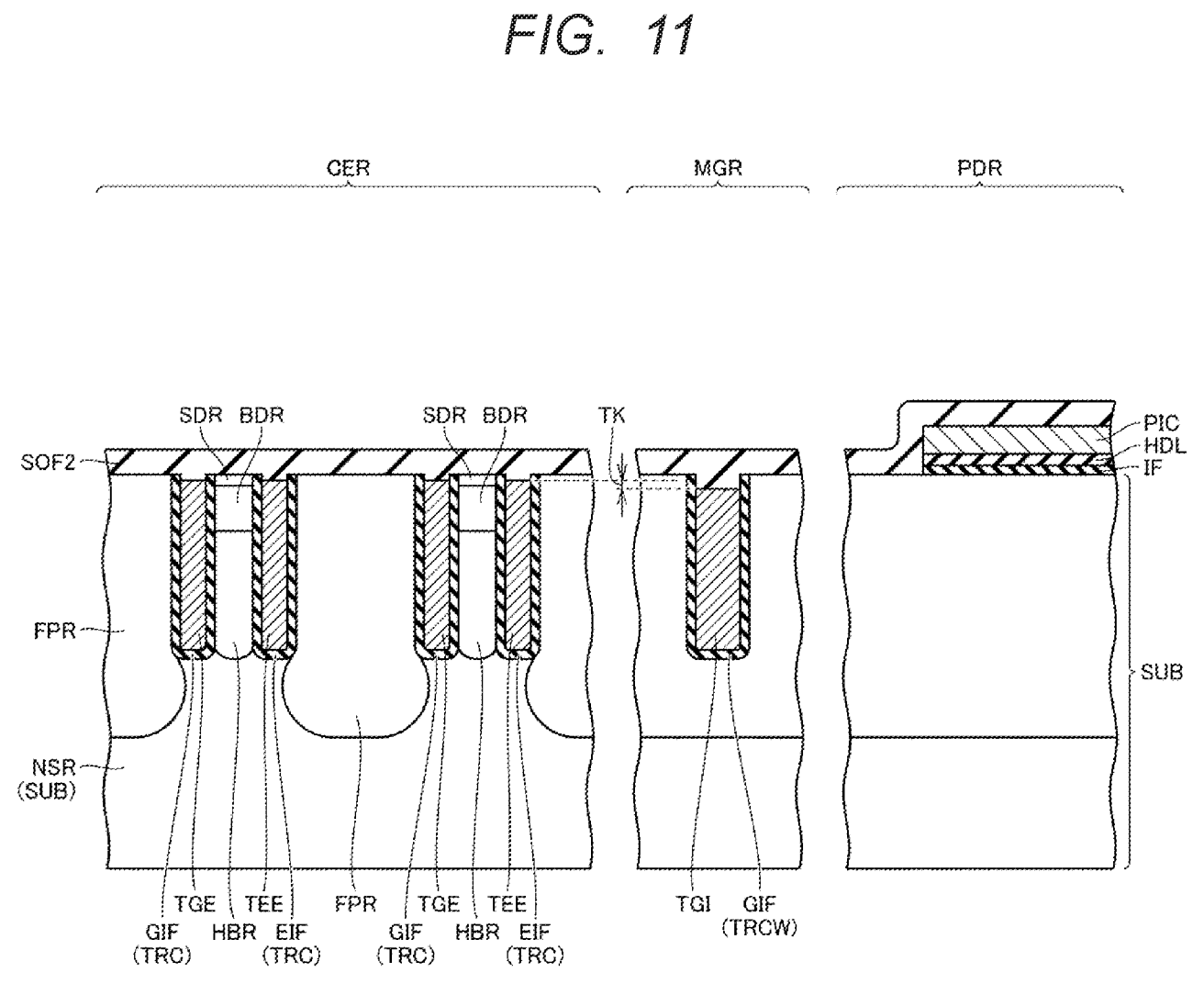

Next, as shown in FIG. 11, a silicon oxide film SOF2 is formed so as to cover the first main surface of the semiconductor substrate SUB. Next, a photoresist pattern (not shown) for forming the source diffusion layer and the base diffusion layer is formed by performing a predetermined photolithography process. Next, P-type impurities are implanted using the photoresist pattern as an implantation mask. Further, the N-type impurities are implanted. Thereafter, the photoresist pattern is removed.

As a result, the source diffusion layer SDR and the base diffusion layer BDR are formed in a region of the semiconductor substrate SUB located between the trench emitter electrode TEE and the trench gate electrode TGE. The base diffusion layer BDR is formed at a position shallower than a predetermined depth (forth depth D4) from the first main surface. The source diffusion layer SDR is formed from the first main surface to a position shallower than a bottom (forth depth D4) of the base diffusion layer BDR. Thereafter, the silicon oxide film SOF2 is removed.

Figure 12:
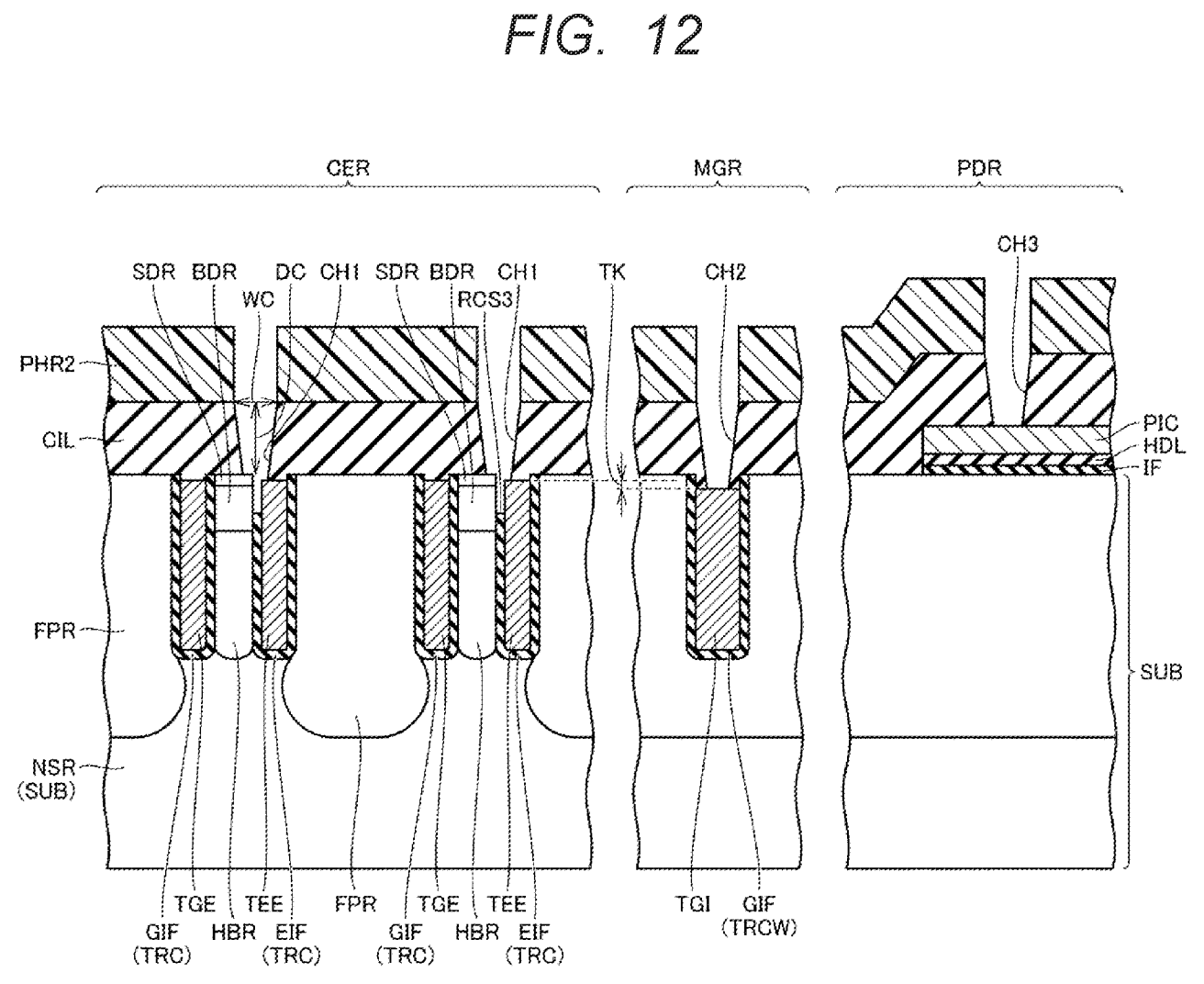

Next, the interlayer insulating film CIL is formed so as to cover the first main surface of the semiconductor substrate SUB (see FIG. 12). As the interlayer insulating film CIL, for example, a PSG film (Phospho Silicate Glass) is formed. Next, by performing a predetermined photolithography process, a photoresist pattern PHR2 for forming a contact opening is formed in the interlayer insulating film CIL (see FIG. 12).

Next, as shown in FIG. 12, an etching process is performed on the interlayer insulating film CIL using the photoresist pattern PHR2 as an etching mask. By this etching process, a contact opening CH1 (first contact opening), a contact opening CH2 (third contact opening), and a contact opening CH3 (fourth contact opening) are simultaneously formed.

Here, since an opening depth is large with respect to the opening width of the contact opening and the aspect ratio (the opening depth DC against opening width WC) is high (1.4 to 2.5), an anisotropic etching process is applied as an etching process. In this anisotropic etching, a condition is set such that an etching selectivity of an etching rate of the interlayer insulating film CIL (insulating film EIF) to an etching rate of the semiconductor substrate SUB (trench emitter electrode TEE) is high. By this anisotropic etch process, the contact opening CH1 and the like are formed in a tapered shape.

Further, as described above, a position of an upper surface of the trench gate lead-out electrode TGI (polysilicon film PSF) formed in the trench TRCW is lower than a position of an upper surface of the trench emitter electrode TEE (polysilicon film PSF) formed in the trenches TRC by the thickness TK.

Therefore, in this anisotropic etching, when the upper surface of the trench emitter electrode TEE is exposed, the trench gate lead-out electrode TGI is still covered with interlayer insulating film CIL state to the thickness TK. Then, after the trench emitter electrode TEE is exposed, the insulating film EIF interposed between the trench emitter electrode TEE and the base diffusion layer BDR (semiconductor substrate SUB) is also etched until the trench gate lead-out electrode TGI is exposed. As a result, the upper surface of the insulating film EIF is retracted, the third portion RCS3 is formed, and an exposed area of the base diffusion layer BDR is widened. Thereafter, the photoresist pattern PHR2 is removed.

Figure 13:
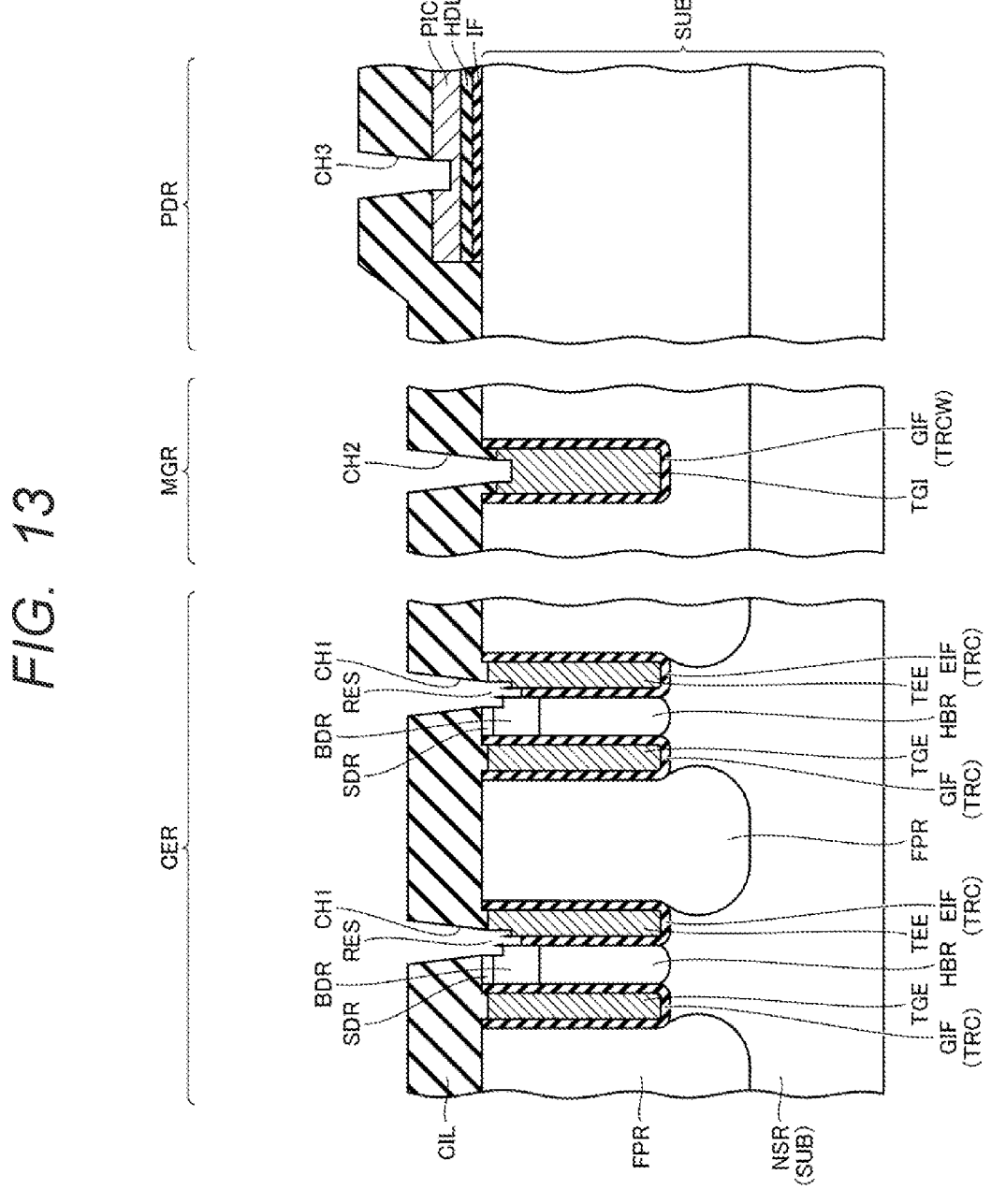
FIG. 13 is a cross-sectional view showing a step performed after the step shown in FIG. 12 in the first embodiment.

Next, as shown in FIG. 13, the trench emitter electrode TEE, the base diffusion layer BDR, and the source diffusion layer SDR exposed at a bottom of the contact opening CH1 are performed to an anisotropic etching. As a result, a part of an upper surface of the trench emitter electrode TEE is retracted, and a part of an upper surface of the base diffusion layer BDR is retracted. At this time, since the upper surface of the trench emitter electrode TEE is at a position lower than the first main surface of the semiconductor substrate SUB (upper surface of the base diffusion layer BDR), the upper surface of the retreated trench emitter electrode TEE is at a position lower than the upper surface of the retreated base diffusion layer BDR.

This series of anisotropic etchings leaves a portion of the insulating film EIF and a portion of silicon (semiconductor substrate SUB, polysilicon) as a residue RES at the bottom of the contact opening CH1. Next, the residue RES is removed by dry etching. Thus, the recess RCS is formed (see FIG. 14).

Figure 14:
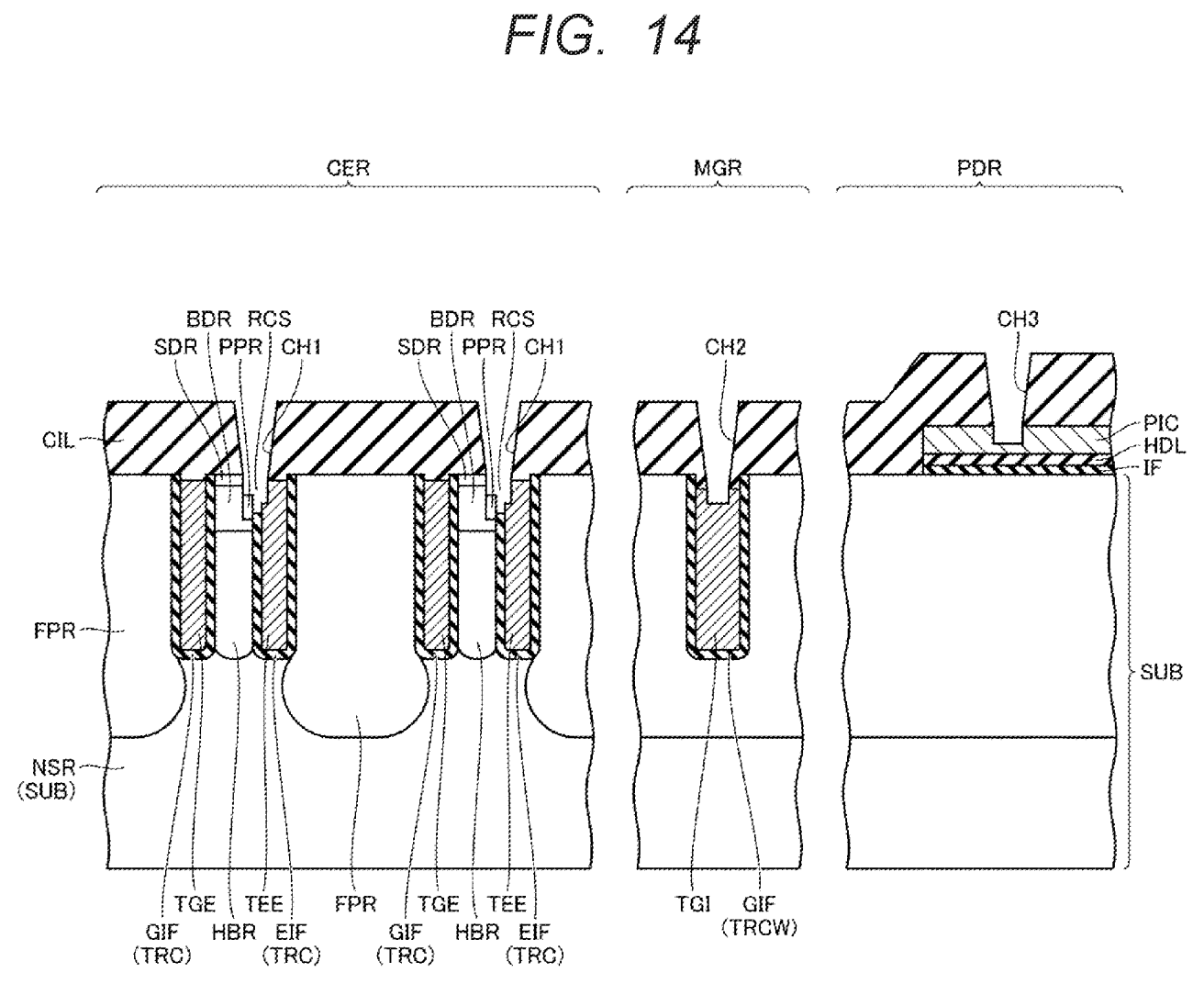

Next, as shown in FIG. 14, P-type impurities is implanted through the contact opening CH1 to the contact opening CH3. At this time, the P+ layer PPR having an impurity concentration higher than the impurity concentration of the base diffusion layer BDR is formed on the base diffusion layer BDR exposed at the bottom (recess RCS) of the contact opening CH1. As a result, the contact resistance between the shared contact member CCN and the P+ layer PPR (the base diffusion layer BDR) is reduced.

On the other hand, at the bottom of the contact opening CH1, P-type impurities are also implanted into a side surface of the source diffusion layer SDR exposed in the recess RCS. Therefore, the N-type impurities of the source diffusion layer SDR that the shared contact member CCN contacts with may be neutralized by the P+ type impurities, and a contact resistivity between the source diffusion layer SDR and the shared contact member CCN may increase.

Figure 15:
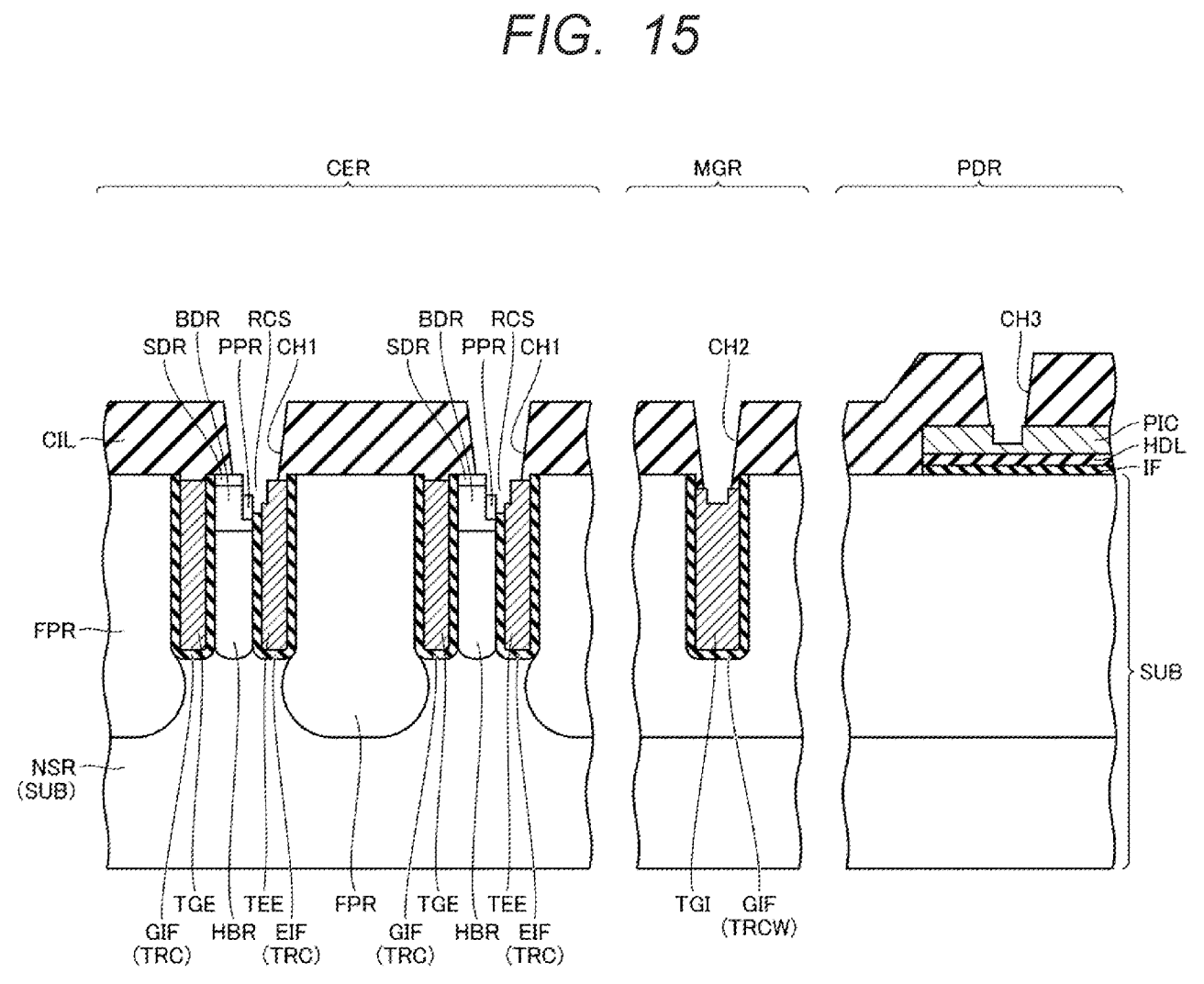
Figure 16:
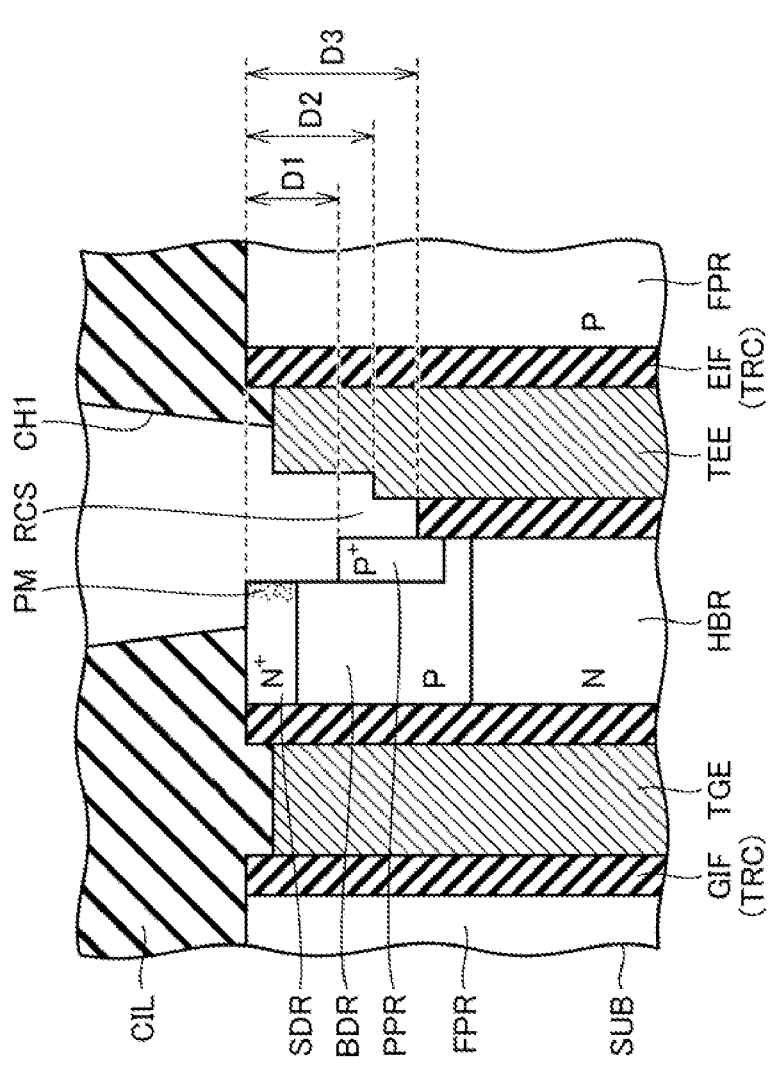
FIG. 16 is a cross-sectional view showing a step performed after the step shown in FIG. 15 in the first embodiment.

Then, as shown in FIG. 15, the interlayer insulating film CIL is performed to a wet etching process to widen an opening area of the contact opening CH1 or the like. As shown in FIG. 16, an opening of the contact opening CH1 is widened, so that an upper surface of the source diffusion layer SDR into which the P-type impurities PM is not implanted is exposed. Accordingly, a contact resistance between the shared contact member CCN and the source diffusion layer SDR is reduced.

Figure 17:
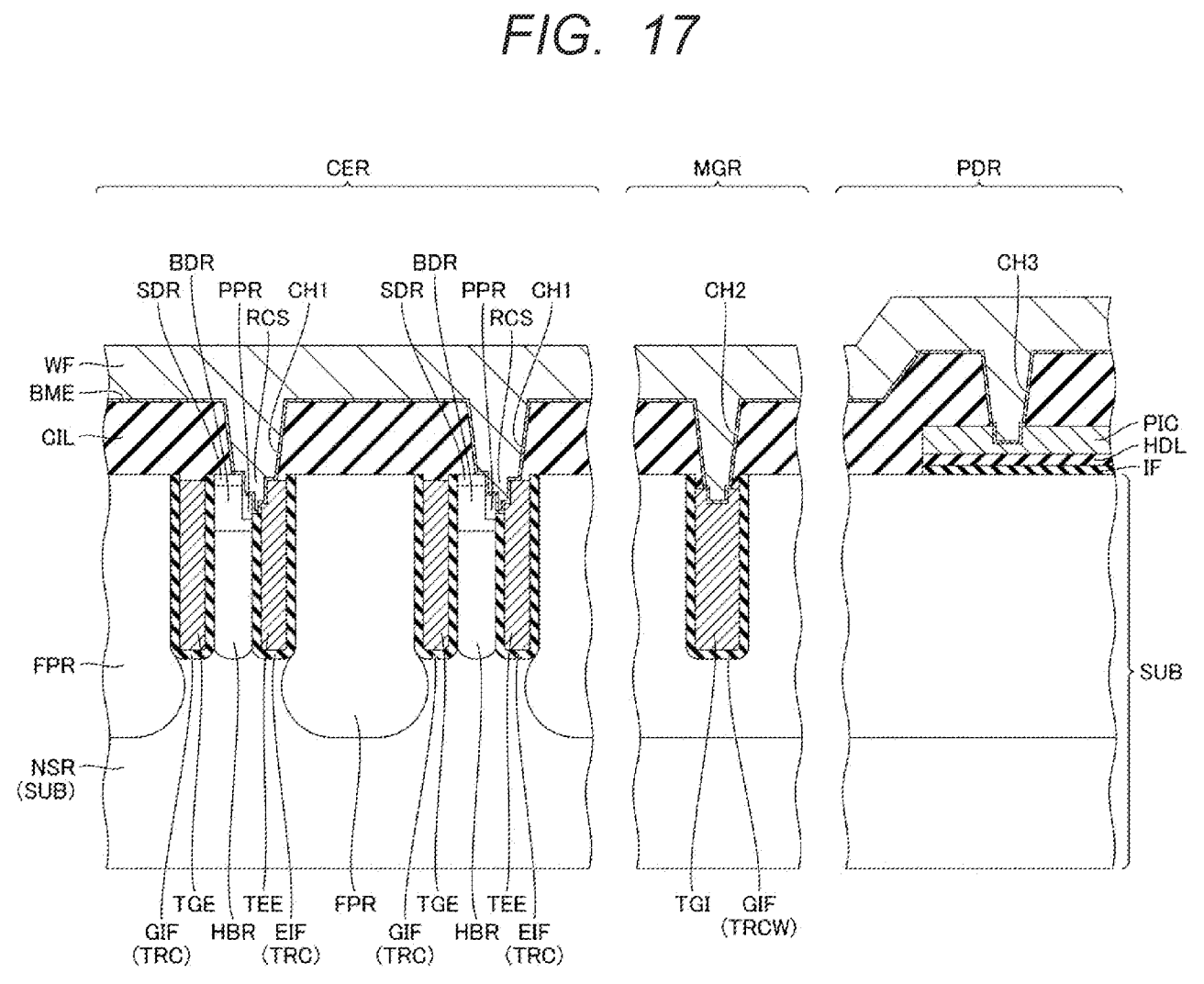

Next, as shown in FIG. 17, the barrier metal film BME is formed so as to cover the interlayer insulating film CIL including inner wall surfaces of the contact openings CH1 to CH3. As the barrier metal film BME, for example, a laminated film of titanium nitride (TiN) and titanium (Ti) is formed. Next, a tungsten film WF is formed so as to cover the barrier metal film BME. Next, the tungsten film WF and the barrier metal film BME located on an upper surface of the interlayer insulating film CIL are removed by performing an entire etch back process on the tungsten film WF and the like.

Figure 18:
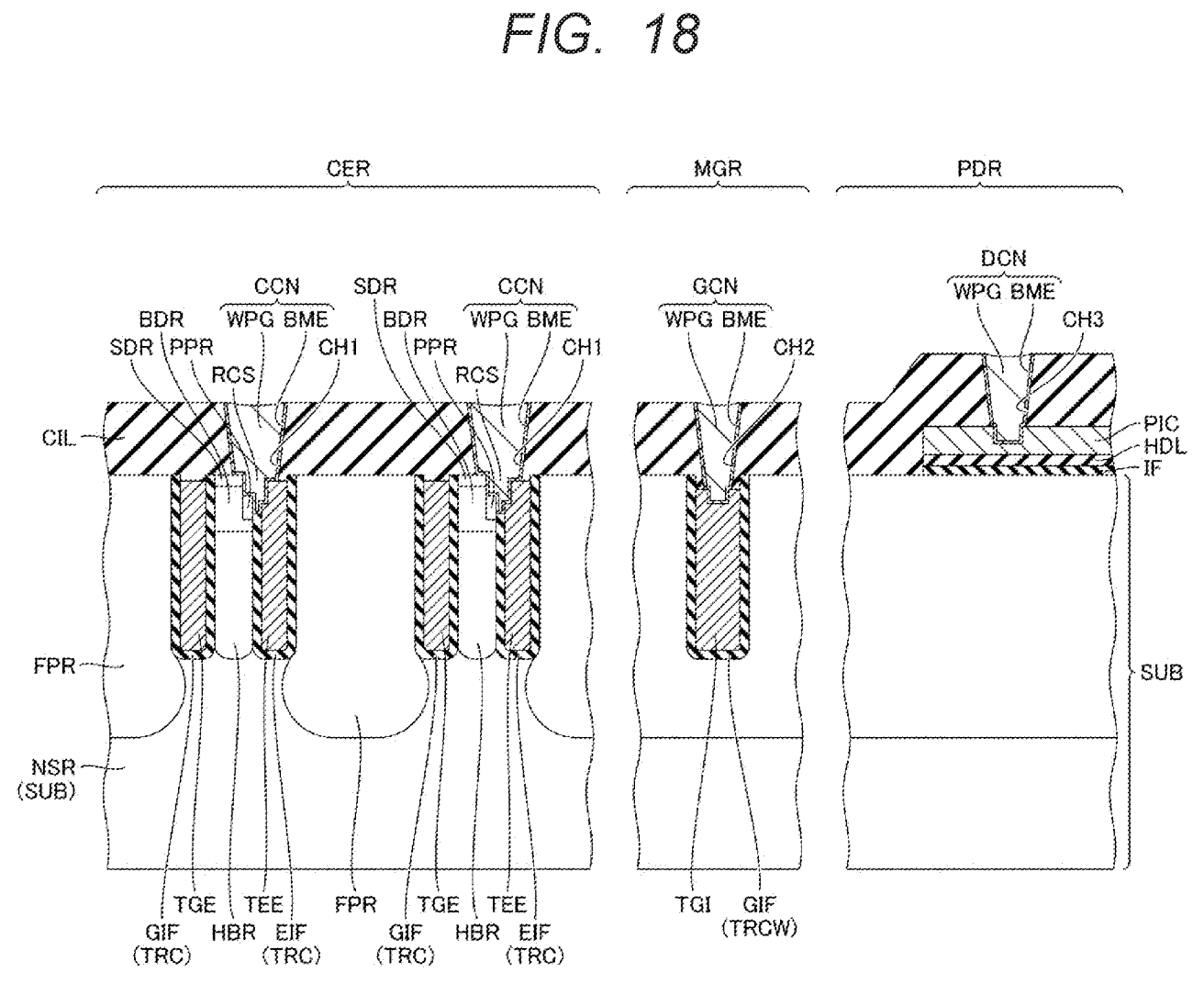

As a result, as shown in FIG. 18, the shared contact member CCN is formed by the tungsten film WF and the barrier metal film BME left in the contact opening CH1. The gate lead-out contact member GCN is formed by the tungsten film WF and the barrier metal film BME left in the contact opening CH2. The contact member DCN is formed by the tungsten film WF and the barrier metal film BME left in the contact opening CH3.

Thereafter, an aluminum film (not shown) is formed so as to cover the interlayer insulating film CIL, and the aluminum film is patterned to form the emitter electrode MEE, the gate lead-out wiring MGI, the gate electrode MGE, and the like (see FIG. 3 and the like). Next, the N-type buffer layer NBR and the P-type collector diffusion layer CDR are formed on the second main surface of the semiconductor substrate SUB. In addition, the collector electrode BEL (bottom surface electrode) is formed to complete the semiconductor device.

Next, an operation of the above-described semiconductor device SED will be described. First, when the insulated gate bipolar transistor is turned on, a voltage equal to or higher than a threshold voltage is applied to the gate electrode MGE. As a result, electrons are injected from the source diffusion layer SDR to the N-type region NSR (drift layer) in the semiconductor substrate SUB through channels, and PN-junction between the N-type region NSR and the collector diffusion layer CDR is forward biased, so that holes are injected from the collector diffusion layer CDR into the N-type region NSR.

The injected holes are prevented from escaping by the P-type floating diffusion layer FPR toward the source diffusion layer SDR (emitter), and the holes are accumulated in the N-type regions NSR and the floating diffusion layer FPR, thereby increasing a concentration of the holes. When the concentration of the holes in the N-type regions NSR or the like increases, the electrons injection from the source diffusion layer SDR is promoted, and a concentration of the electrons also increases. In this way, the concentration of carriers in the N-type regions NSR or the like is increased, so that the conductivity is modulated and turned on.

Next, when the insulated gate bipolar transistor is turned off, the voltage lower than the threshold voltage is applied to the gate electrode MGE. This causes the channels to disappear. The carriers (holes) accumulated in the N-type region NSR and the like are discharged to the emitter electrode MEE by a parasitic P-channel MOSFET (the floating diffusion layer FPR, the trench emitter electrode TEE of the emitter potential, the base diffusion layer BDR, and the like) formed on the trench emitter electrode TEE, and are turned off.

In the above-described semiconductor device SED, the shared contact member CCN electrically connecting the base diffusion layer BDR and the like to the emitter electrode MEE contacts the recess RCS. The recess RCS is formed so as to straddle the trench emitter electrode TEE, the insulating film EIF, the base diffusion layer BDR, and the like. The recess RCS includes the first portion RCS1 formed in the base diffusion layer BDR, the second portion RCS2 formed in the trench emitter electrode TEE, and the third portion RCS3 formed in the insulating film EIF.

The third portion RCS3 is located at the deepest position (at the third depth D3) with respect to the first portion RCS1 and the second portion RCS2 within the first portion RCS1, the second portion RCS2 and the third portion RCS3. Therefore, the contact area between the shared contact member CCN and the base diffusion layer BDR is increased and the contact area between the shared contact member CCN and the trench emitter electrode TEE is increased as the upper surface of the insulating film EIF is lowered (retreated), thereby reducing the contact resistivity.

As a result, carriers (holes) accumulated in the N-type region NSR and the like are efficiently discharged from the base diffusion layer BDR to the emitter electrode MEE via the shared contact member CCN. As a result, the time until turn-off is shortened, and it is possible to contribute to reduce of turn-off loss.

In addition, in order to retract the position of the third portion RCS3 formed in the insulating film EIF to a position deeper than the respective positions of the first portion RCS1 and the second portion RCS2, the third portion RCS3 can be formed by over etching at the time of forming the contact opening in the interlayer insulating film CIL.

As described above, in a step illustrated in FIG. 18, a position of an upper surface of the gate lead-out wiring MGI (polysilicon film PSF) is lower than a position of an upper surface of the trench emitter electrode TEE (polysilicon film PSF) by the thickness TK.

Thus, after the trench emitter electrode TEE is exposed, the insulating film EIF is also etched until the trench gate lead-out electrode TGI is exposed, and the position of the upper surface of the insulating film EIF can be lowered (retreated) without adding a new step.

Further, as described above, the shared contact member CCN includes a part of the source diffusion layer SDR that contacts the upper surface of the N-type source diffusion layer SDR. In a step illustrated in FIG. 14, when the P+ layer PPR is formed, the P-type impurities are implanted into the side surface of the exposed N-type source diffusion layer SDR, and the N-type impurities are neutralized by the P-type impurities.

Therefore, in a step illustrated in FIG. 15, by increasing the opening width of the contact opening CH1 or the like, upper surface of the source diffusion layer SDR into which the P-type impurities are not implanted is exposed, and the shared contact member CCN contacts the upper surface of the source diffusion layer SDR, whereby the contact resistance can be reduced.

Figure 19:
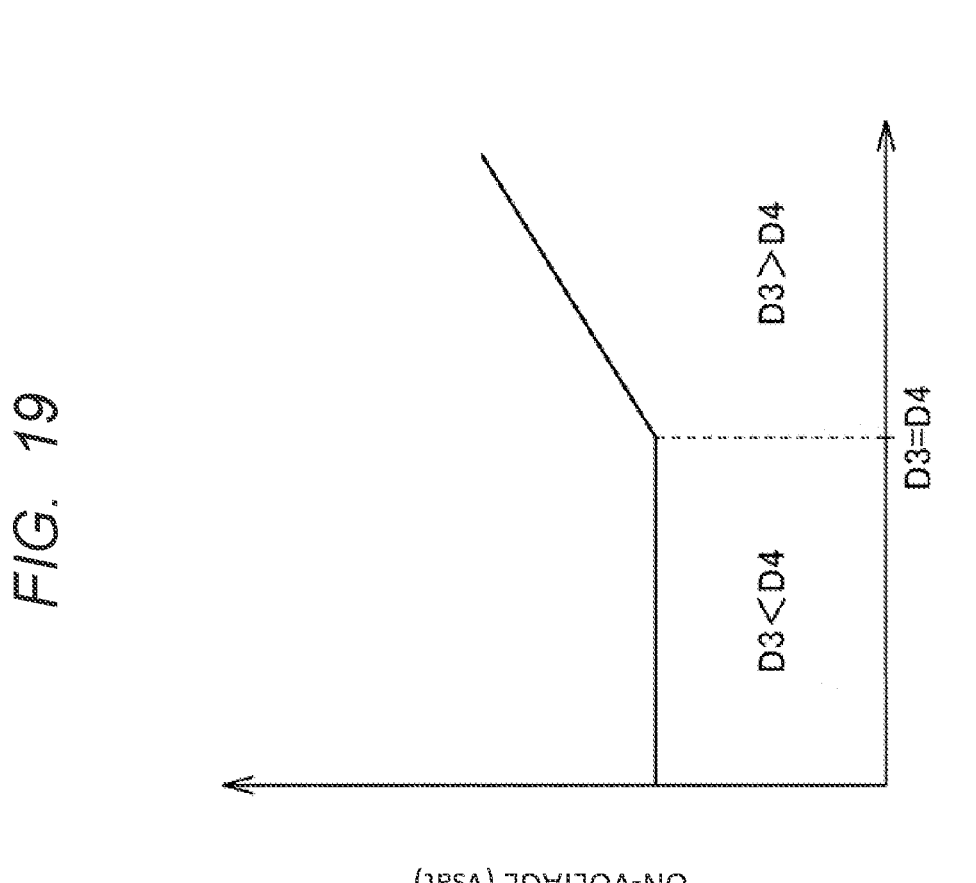
FIG. 19 is a graph qualitatively showing a dependence of an on-voltage on a relationship between a depth of a base diffusion layer and a position of the insulating film in the first embodiment.

As shown in FIG. 4, the position (third depth D3) of the upper end of the insulating film EIF needs to be adjusted so as to be shallower than the bottom (fourth depth D4) of the base diffusion layer BDR. This will be explained. FIG. 19 graphically illustrates a qualitative relationship between the third depth D3 and the fourth depth D4 and an on-voltage Vsat.

As shown in FIG. 19, when a state (third depth D3) of the upper end of the insulating film EIF is shallower than the bottom (fourth depth D4) of the base diffusion layer BDR (third depth D3<fourth depth D4), the on-voltage (the collector voltage required to flow the rated current while the gate electrode MGE is turned on) is constant.

However, when the position (third depth D3) of the upper end of the insulating film EIF is deeper than the bottom (fourth depth D4) of the base diffusion layer BDR (third depth D3>fourth depth D4), the on-voltage Vsat gradually increases as the position (third depth D3) of the upper end of the insulating film EIF becomes deeper. In other words, the hole passes through the shared contact member CCN.

Since it is desirable that the on-voltage Vsat be lower, in the etching of the insulating film EIF, the position (third depth D3) of the upper end of the insulating film EIF should not be deeper than the bottom (fourth depth D4) of the base diffusion layer BDR. In this situation, a variation of etching and the variation of ion implantation require controlling the depth of the base diffusion layer BDR because the variation of etching is larger than that of ion implantation.

Second Embodiment

Figure 20:
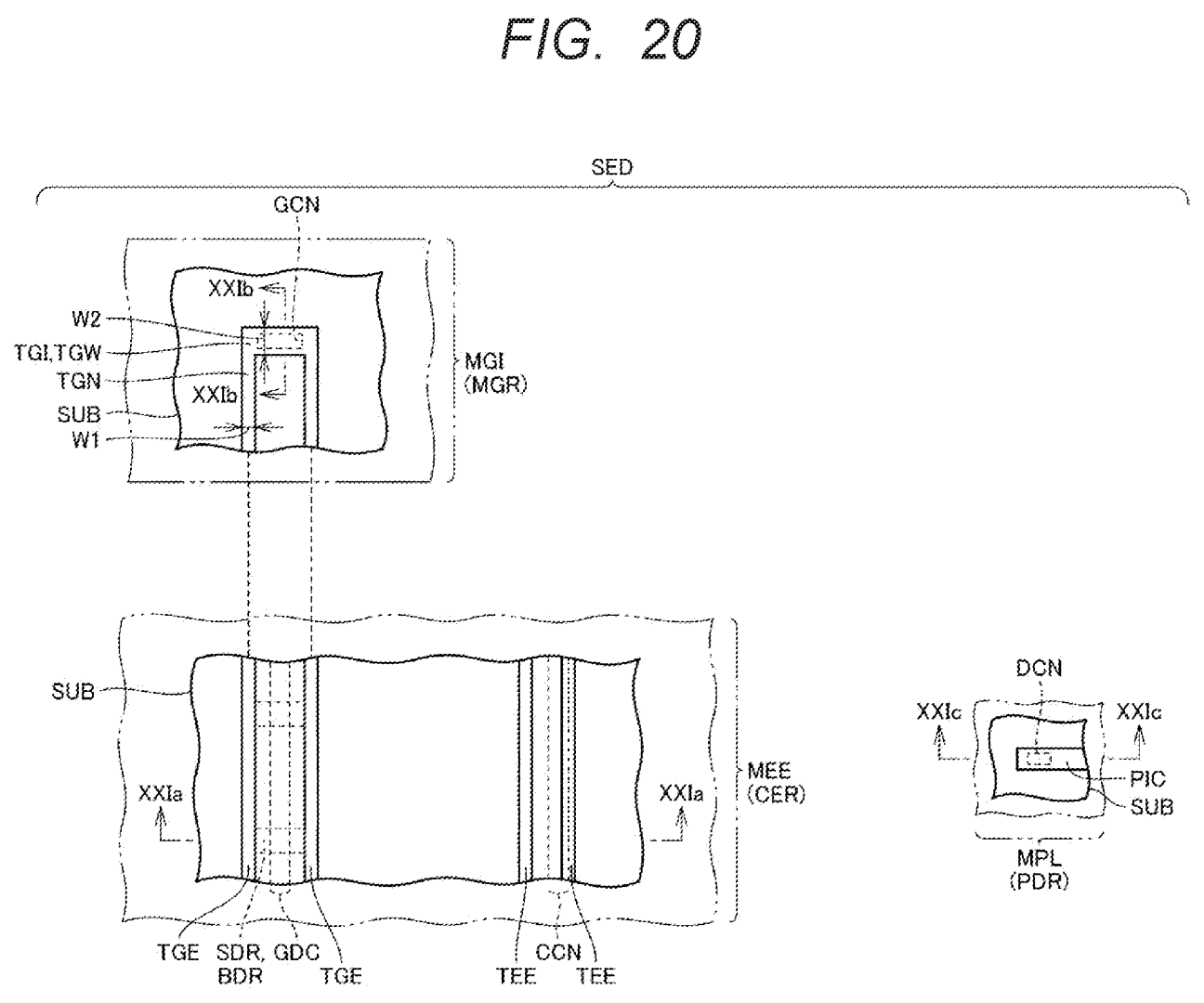
Figure 21:
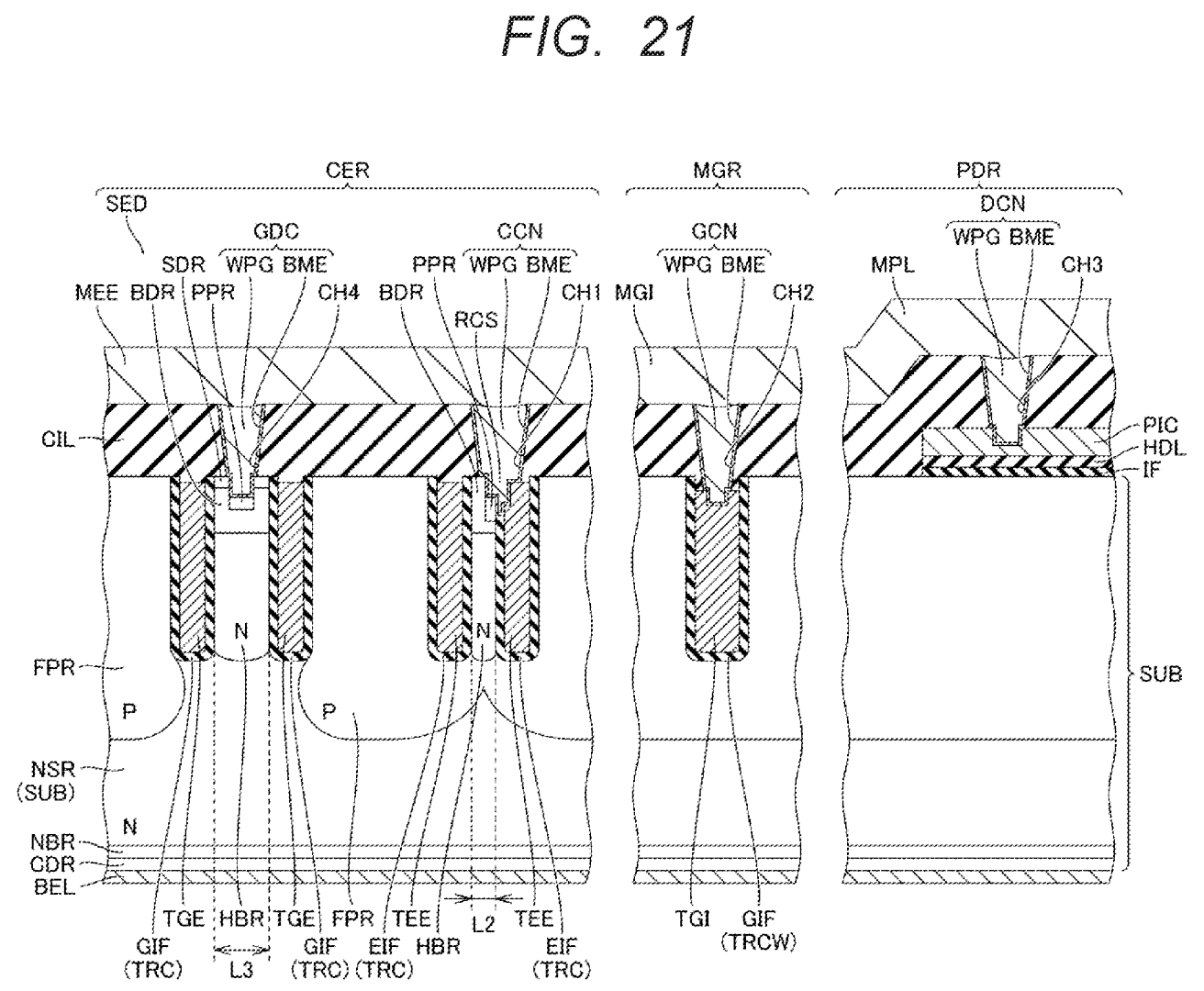

Here, an exemplary GGEE type semiconductor device will be described. The GGEE type semiconductor device is applied to applications that require stable operation or the like. First, a cell region CER will be described. As shown in FIGS. 20 and 21, one trench emitter electrode TEE (first trench emitter electrode) and other trench emitter electrode TEE (second trench emitter electrode) are spaced apart from each other in a first direction. A distance between the one trench emitter electrode TEE and the other trench emitter electrode TEE is a space L2. The one trench emitter electrode TEE and the other trench emitter electrode TEE extend in a second direction intersecting the first direction, respectively.

One trench gate electrode TGE (first trench gate electrode) and other trench gate electrode TGE (second trench gate electrode) are spaced apart in the first direction. A distance between the one trench gate electrode TGE and the other trench gate electrode TGE is a space L3. The one trench gate electrode TGE and the other trench gate electrode TGE each extend in the second direction intersecting the first direction.

Further, the one trench emitter electrode TEE and the other trench emitter electrode TEE are spaced apart from the one trench gate electrode TGE and the other trench gate electrode TGE in the first direction.

In a region (first region) of a semiconductor substrate SUB located between the one trench emitter electrode TEE and the other trench emitter electrode TEE, a P-type base diffusion layer BDR is formed over a predetermined depth (fourth depth D4) from a first main surface. In the base diffusion layer BDR, a P+ layer PPR having a higher P-type impurity concentration is formed.

In a region (second region) of the semiconductor substrate SUB located between the one trench gate electrode TGE and the other trench gate electrode TGE, an N-type source diffusion layer SDR (third impurity region) is formed over a predetermined depth from the first main surface. The base diffusion layer BDR (first impurity region) is formed from a bottom of the source diffusion layer SDR to a predetermined depth (fourth depth D4).

Figure 22:
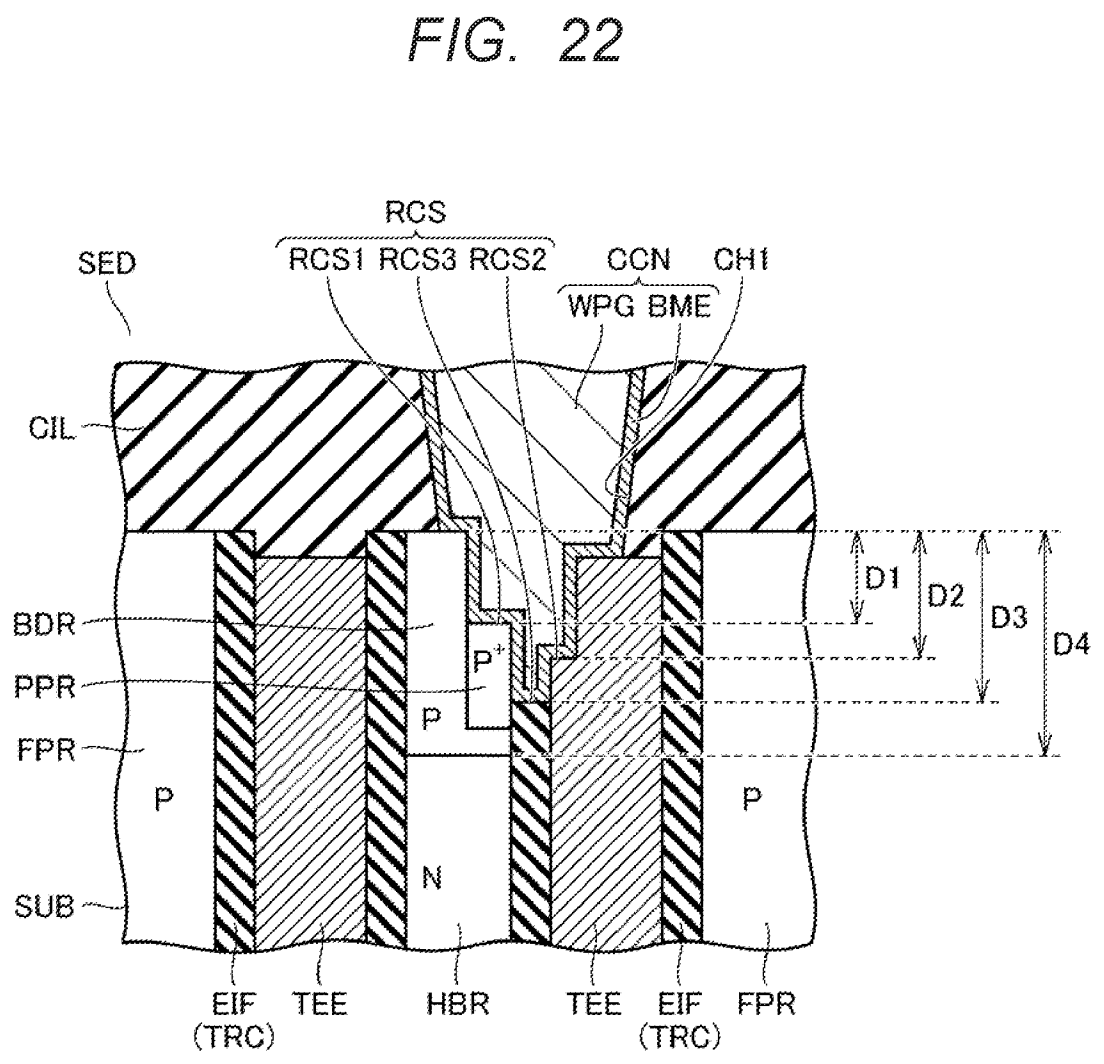

An interlayer insulating film CIL is formed to cover the first main surface of the semiconductor substrate SUB. Through the interlayer insulating film CIL. A shared contact member CCN and a gate contact member GDC are formed. As shown in FIG. 22, in the one trench emitter electrode TEE, the base diffusion layer BDR, and an insulating film EIF, a recess RCS is formed on the semiconductor substrate SUB which retreats from the first main surface toward a second main surface opposite to the first main surface.

The recess RCS is formed so as to straddle between the trench emitter electrode TEE and the base diffusion layer BDR. The recess RCS includes a first portion RCS1 formed in the base diffusion layer BDR, a second portion RCS2 formed in the one trench emitter electrode TEE, and a third portion RCS3 formed in the insulating film EIF.

As illustrated in FIG. 22, the first portion RCS1 has a first depth D1 from the first main surface. The second portion RCS2 is has a second depth D2 from the first main surface deeper than the first depth D1. The third portion RCS3 has a third depth D3 from the first main surface deeper than the first depth D1 and the second depth D2, and shallower than the fourth depth D4 of the base diffusion layer BDR. The shared contact member CCN has a protruding structure on the semiconductor substrate SUB protruding from the first main surface toward the second main surface in a manner contacting the first portion RCS1, the second portion RCS2, and the third portion RCS3.

On the other hand, as shown in FIG. 21, the gate contact member GDC is formed so as to be in contact with the source diffusion layer SDR and the base diffusion layer BDR formed in a region (second region) of the semiconductor substrate SUB.

In addition, a space L2 between the one trench emitter electrode TEE and the other trench emitter electrode TEE adjacent to each other may be narrower than a space L1 between the one trench gate electrode TGE and the one trench emitter electrode TEE in the above-described semiconductor device SED. This is because the shared contact member CCN may be contacted with the other trench emitter electrode TEE. Since other configurations are the same as those of the semiconductor device SED illustrated in FIGS. 2 and 3, the same members are denoted by the same reference numerals, and the explanation thereof is not repeated unless otherwise required.

Next, an exemplary manufacturing method of the above-described semiconductor device SED will be described. the trench emitter electrodes TEE (trenches TRC (first trench, second trench)) and the trench gate electrodes TGE (trenches TRC (third trench, fourth trench)) and arrangement pattern differs from the arrangement pattern of the trench gate electrode TGE and the trench emitter electrode TEE in the semiconductor device SED described in the first embodiment, and the semiconductor device SED is manufactured by substantially the same manufacturing method as manufacturing method of the semiconductor device SED in the first embodiment.

Figure 23:
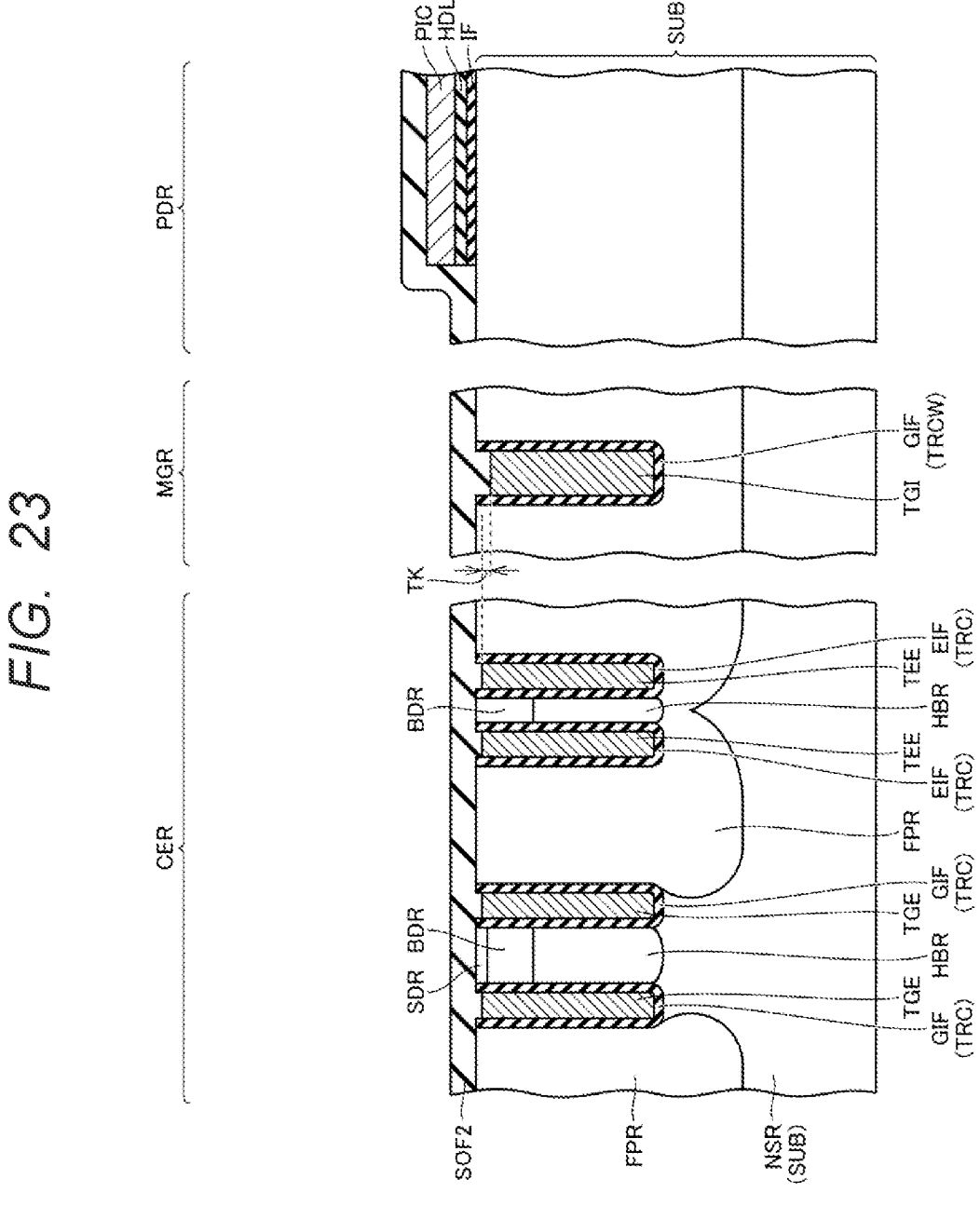
FIG. 23 is a cross-sectional view showing a step of a manufacturing method of a semiconductor device in the second embodiment.

After substantially the same steps as those shown in FIGS. 5 to 10, a silicon oxide film SOF2 is formed so as to cover the first main surface of the semiconductor substrate SUB as shown in FIG. 23. Next, a photoresist pattern (not shown) for forming the base diffusion layer BDR is formed by performing a predetermined photolithography process. Next, the base diffusion layer BDR is formed by implanting P-type impurities using the photoresist pattern as an implantation mask.

Next, after the photoresist pattern is removed, a predetermined photolithography process is performed to form a photoresist pattern (not shown) for forming the source diffusion layer SDR. Next, the source diffusion layer SDR is formed by implanting N-type impurities using the photoresist pattern as an implantation mask. Thereafter, the photoresist pattern is removed.

As a result, the base diffusion layer BDR is formed in the regions of the semiconductor substrate SUB located between the one trench emitter electrode TEE and the other trench emitter electrode TEE adjacent to each other. In addition, the base diffusion layer BDR and the source diffusion layer SDR are formed in regions of the semiconductor substrate SUB located between the one trench gate electrode TGE and the other trench gate electrode TGE adjacent to each other. Thereafter, the silicon oxide film SOF2 is removed.

Figure 24:
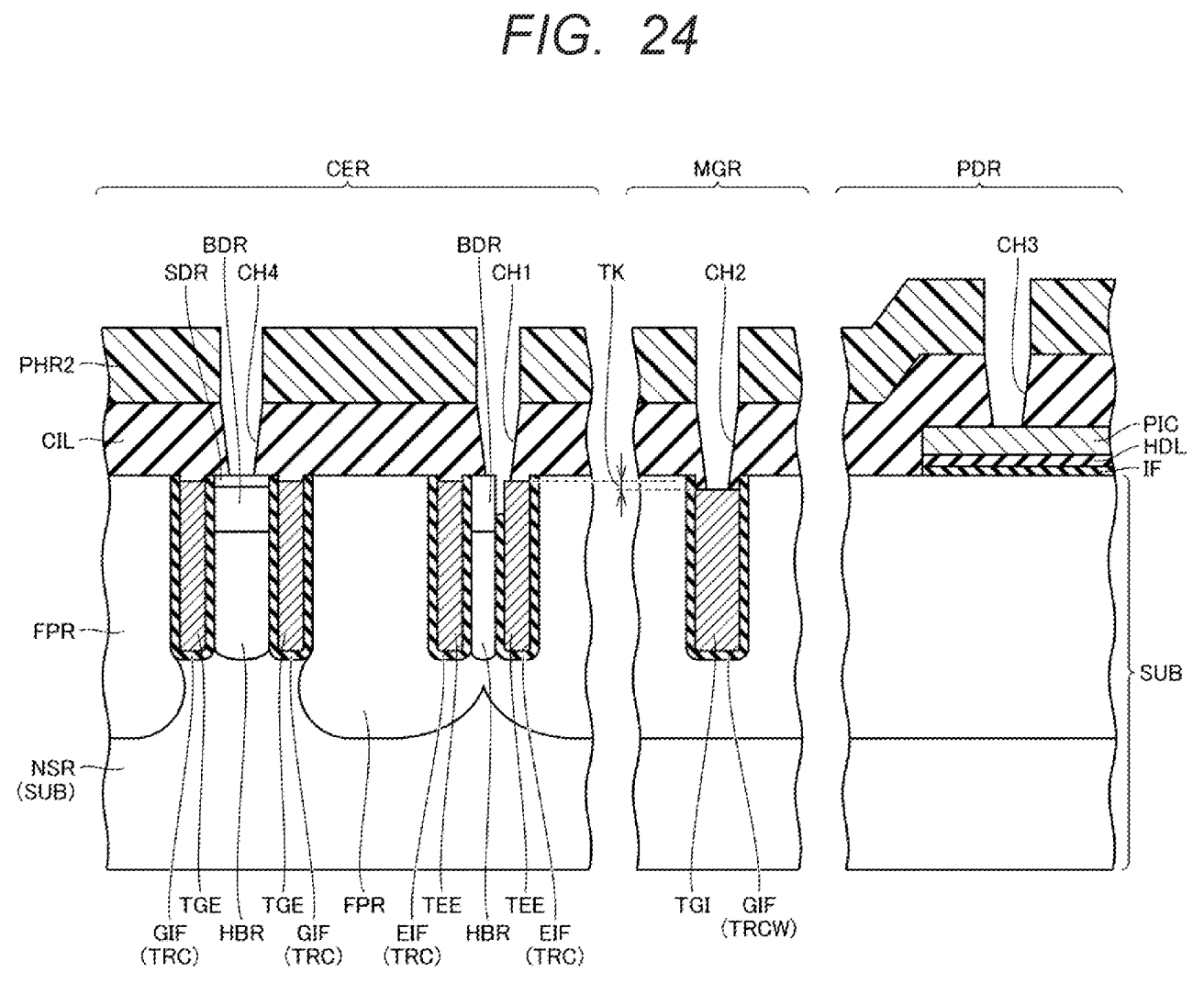

Next, the interlayer insulating film CIL is formed so as to cover the first main surface of the semiconductor substrate SUB (see FIG. 24). Next, by performing a predetermined photolithography process, a photoresist pattern PHR2 for forming a contact opening is formed in the interlayer insulating film CIL. Next, as shown in FIG. 24, an etching process is performed on the interlayer insulating film CIL using the photoresist pattern PHR2 as an etching mask. By this etching process, a contact opening CH1 (first contact opening), a contact opening CH2 (third contact opening), a contact opening CH3 (fourth contact opening), and a contact opening CH4 (second contact opening) are simultaneously formed.

At this time, as described with respect to a step illustrated in FIG. 12, since an aspect ratio (an opening depth DC against an opening width WC) is high (1.4 to 2.5), an anisotropic etching process is applied as an etching process. By this anisotropic etch process, the contact opening CH1 and the like are formed in a tapered shape. In addition, since a position of an upper surface of the trench gate lead-out electrode TGI (polysilicon film PSF) is lower than a position of an upper surface of the trench emitter electrode TEE (polysilicon film PSF) by the thickness TK, during etching a portion corresponding to the thickness TK, the upper surface of the insulating film EIF is lowered (recessed), and the exposed area of the base diffusion layer BDR is expanded. Thereafter, the photoresist pattern PHR2 is removed.

Figure 25:
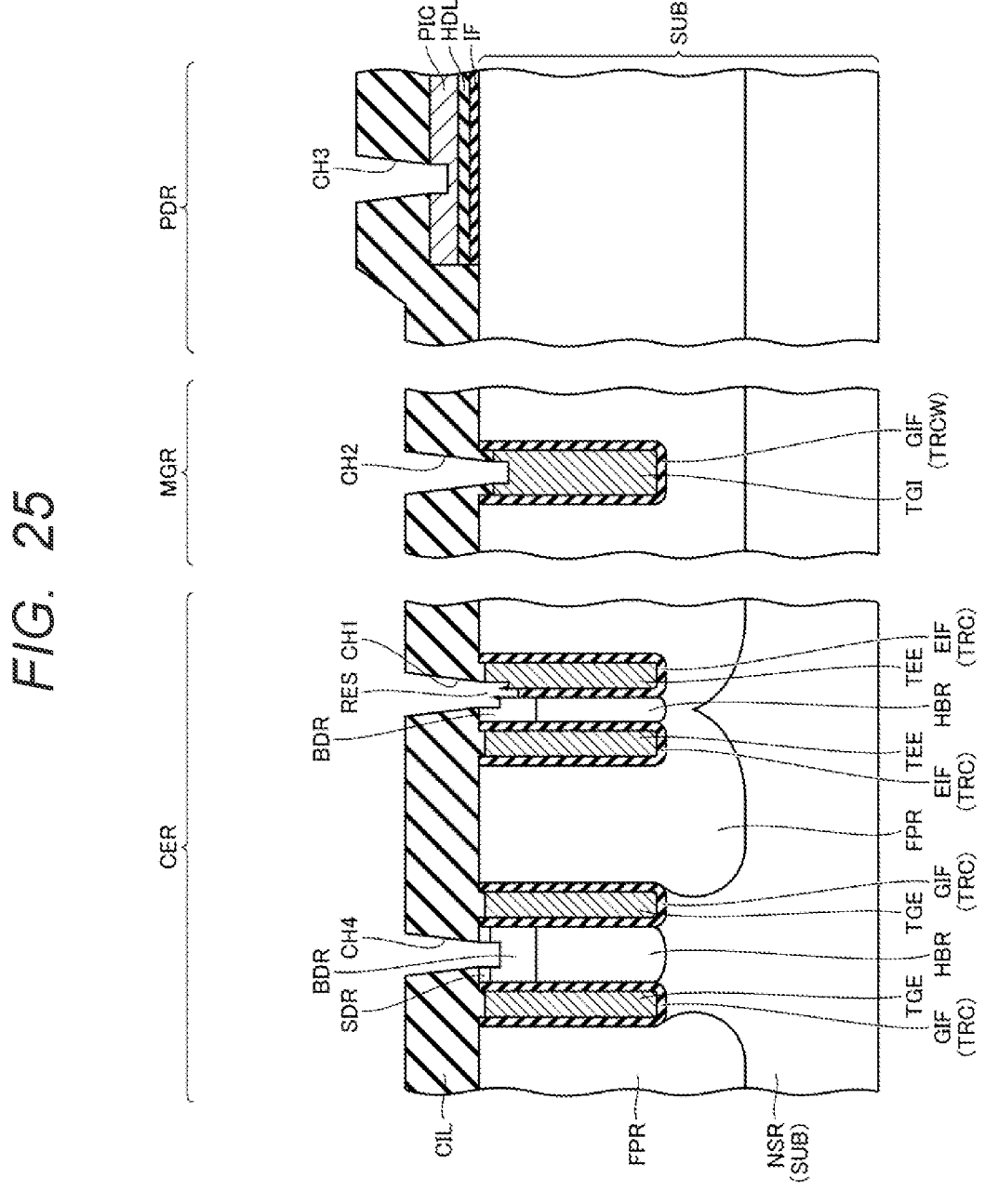
FIG. 25 is a cross-sectional view showing a step performed after the step shown in FIG. 24 in the second embodiment.

Next, as in a step shown in FIG. 13, an anisotropic etching process is performed. As a result, as shown in FIG. 25, the upper surface of the trench emitter electrode TEE exposed at a bottom of the contact opening CH1 is retracted, and an upper surface of the base diffusion layer BDR is retracted. At this time, the source diffusion layer SDR is etched at a bottom of the contact opening CH4, and the base diffusion layer BDR is also exposed. Thereafter, a residual RES remaining on the bottom of the contact opening CH1 is removed by an dry etching.

Figure 26:
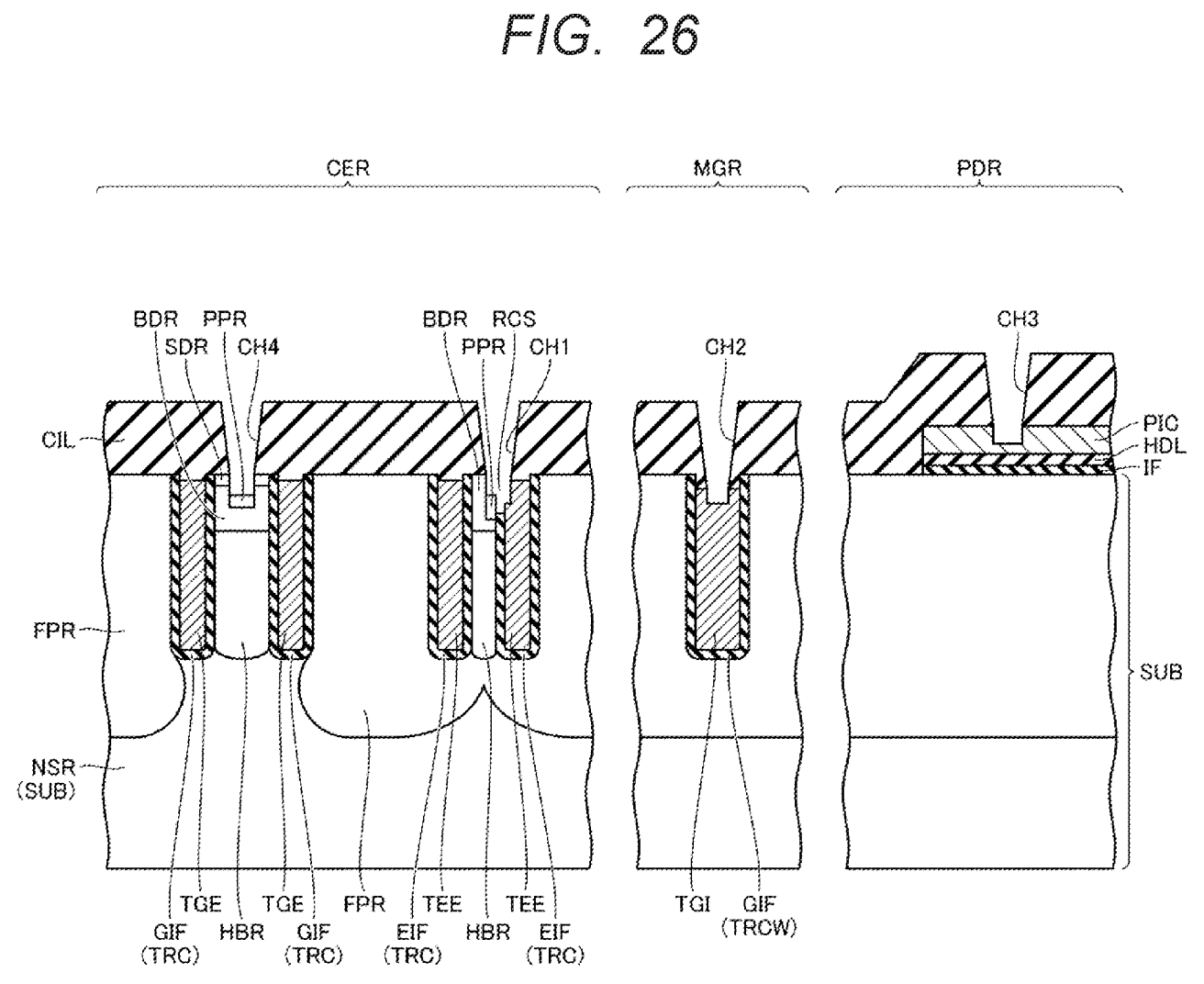
Figure 27:
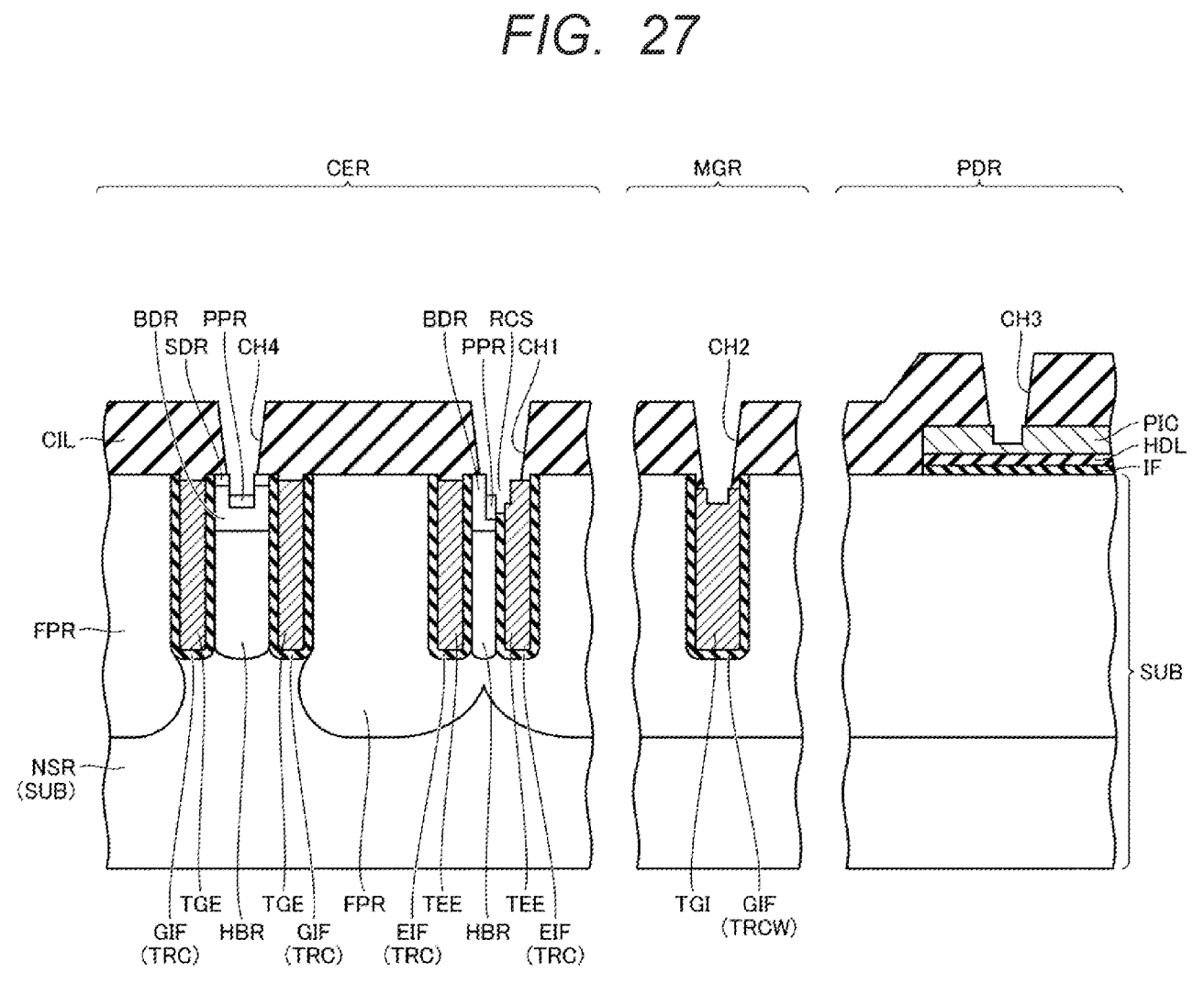
Figure 28:
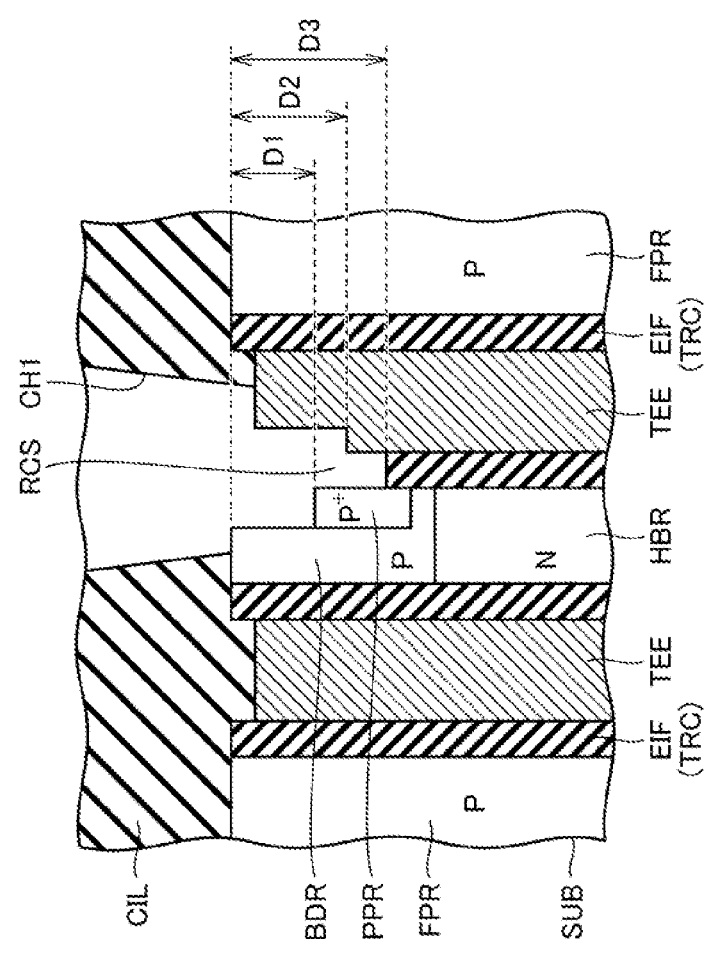
FIG. 28 is a cross-sectional view showing a step performed after the step shown in FIG. 27 in the second embodiment.

Next, as in a step shown in FIG. 14, P+ type impurities are implanted. As a result, as shown in FIG. 26, the P+ layer PPR is formed on the base diffusion layer BDR. Next, as in a step shown in FIG. 15, the interlayer insulating film CIL is performed to a wet etching. As a result, as shown in FIG. 27, the opening width of the contact opening CH1, the contact opening CH4, and the like is widened. As shown in FIG. 28, a recess RCS in which the shared contact member CCN comes into contact is formed at a bottom of the contact opening CH1. At this time, an upper surface of the source diffusion layer SDR in which the P-type impurities is not implanted is exposed at the bottom of the contact opening CH4 by increasing the opening width.

Figure 29:
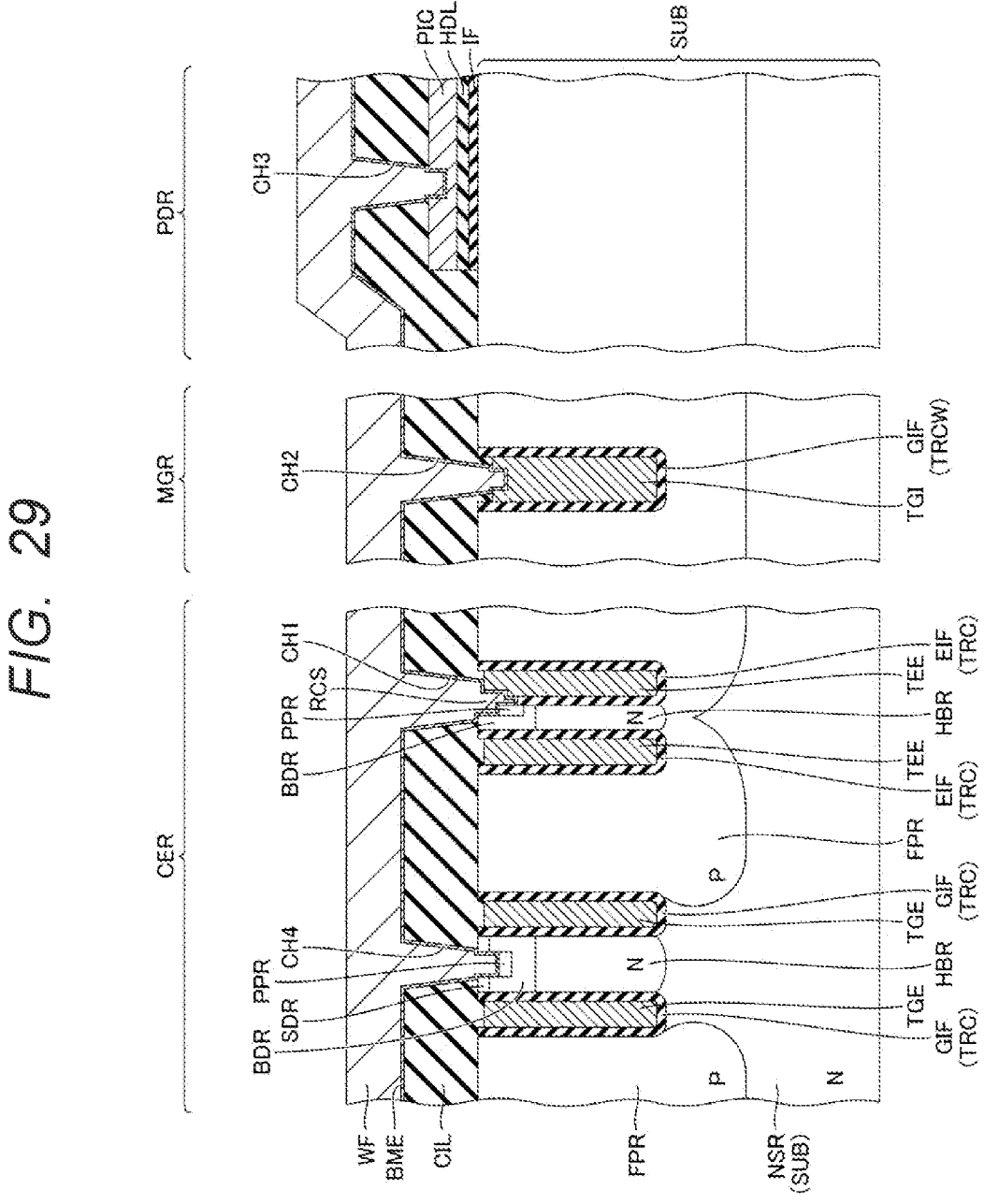
FIG. 29 is a cross-sectional view showing a step performed after the step shown in FIGS. 27 and 28 in the second embodiment.

Next, similarly to a step shown in FIG. 17, as shown in FIG. 29, a barrier metal film BME is formed so as to cover the interlayer insulating film CIL including inner wall surfaces of the contact opening CH1 to CH4. Next, a tungsten film WF is formed so as to cover the barrier metal film BME. Next, the tungsten film WF and the barrier metal film BME located on an upper surface of the interlayer insulating film CIL are removed by performing an entire etch back process on the tungsten film WF and the like.

Figure 30:
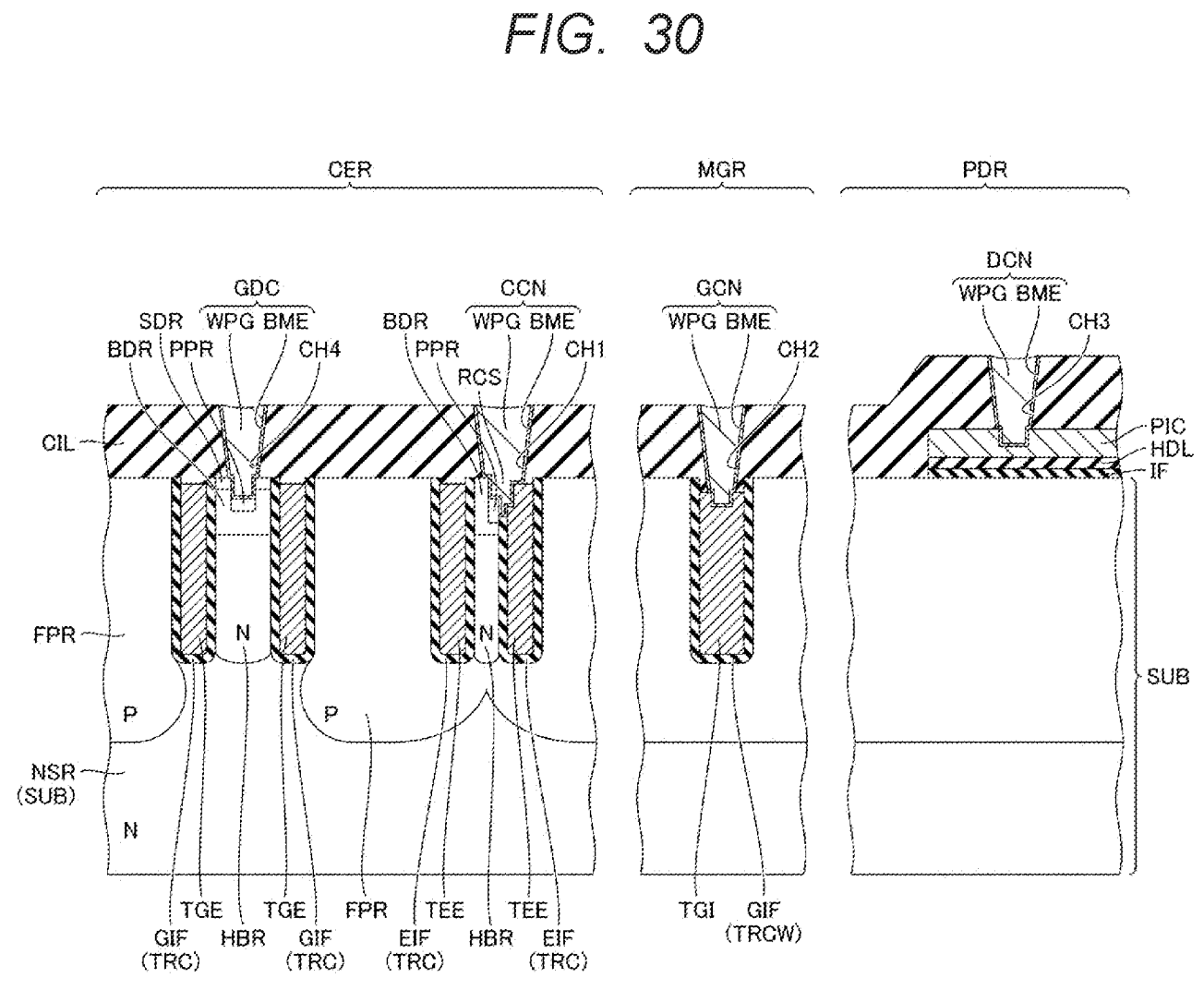

As a result, as shown in FIG. 30, the shared contact member CCN is formed in the contact opening CH1. A gate lead-out contact member GCN is formed in the contact opening CH2. A contact member DCN is formed in the contact opening CH3. The gate contact member GDC is formed in the contact opening CH4. After that, the semiconductor device SED is completed by forming an emitter electrode MEE, a gate lead-out wiring MGI, a gate electrode MGE, and the like.

In the semiconductor device SED described above, as illustrated in FIG. 22, the recess RCS includes a first portion RCS1 formed in the base diffusion layer BDR, a second portion RCS2 formed in the one trench emitter electrode TEE, and a third portion RCS3 formed in the insulating film EIF. The third portion RCS3 is located at the deepest position (third depth D3) with respect to the first portion RCS1 and the second portion RCS2.

Therefore, a contact area between the shared contact member CCN and the base diffusion layer BDR is increased and a contact area between the shared contact member CCN and the one trench emitter electrode TEE is increased as the upper surface of the insulating film EIF is lowered (retreated), thereby reducing the contact resistivity.

As a result, carriers (holes) accumulated in the N-type region NSR and the like are efficiently discharged from the base diffusion layer BDR to the emitter electrode MEE via the shared contact member CCN. As a result, the time until turn-off is shortened, and it is possible to contribute to reduce of turn-off loss.

Further, at a bottom of the contact opening CH4, by increasing the opening width, the source diffusion layer SDR in which the P-type impurities are not implanted is exposed to upper surface, so that a contact resistance between the gate contact member GDC and the source diffusion layer SDR can be reduced.

Third Embodiment

Figure 31:
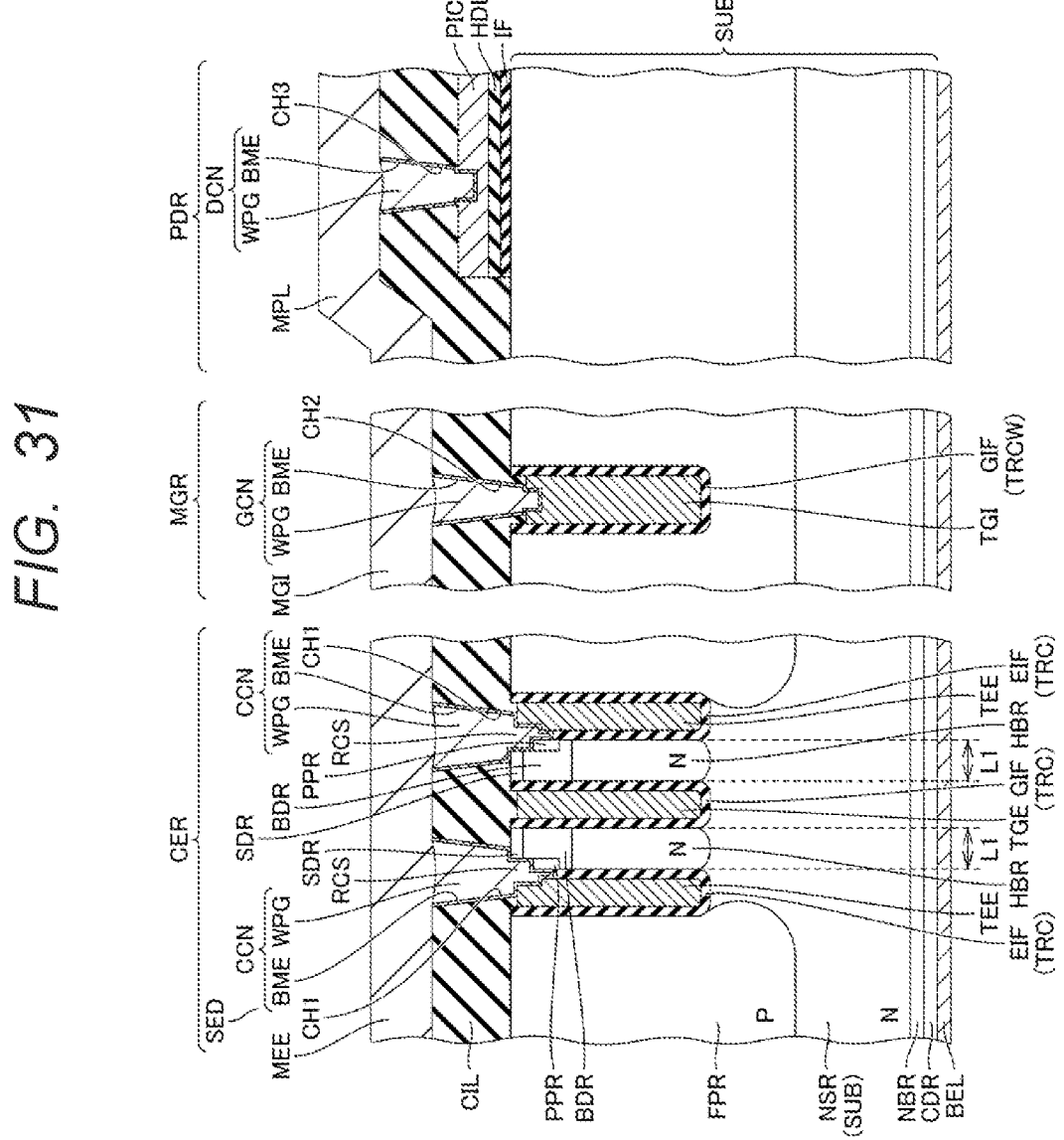
FIG. 31 is a cross-sectional view illustrating an exemplary cross-section structure of a semiconductor device in a third embodiment.

Here, an exemplary EGE type semiconductor device will be described. The EGE type semiconductor device SED is applied to applications requiring high speed. As shown in FIG. 31, in a cell region CER, one trench emitter electrode TEE (first trench emitter electrode), a trench gate electrode TGE (first trench gate electrode) and other trench emitter electrode TEE (third trench emitter electrode) are formed.

The one trench emitter electrode TEE, the trench gate electrode TGE, and the other trench emitter electrode TEE are formed between the one trench emitter electrode TEE and the other trench emitter electrode TEE in such a manner that the trench gate electrode TGE are located at a distance (space L1) from each other.

One recess RCS is formed in the one trench emitter electrode TEE, a base diffusion layer BDR, and an insulating film EIF. And other recess RCS are formed in other trench emitter electrodes TEE, other base diffusion layer BDR, and other insulating film EIF. The one recess RCS and the other recess RCS are formed substantially symmetrically (line target) with respect to the trench gate electrode TGE. One recess RCS and the other recess RCS has the same structure as that of the recess RCS shown in FIG. 4.

Since other configurations are the same as those of the semiconductor device SED shown in FIG. 3 and the like, the same members are denoted by the same reference numerals, and the explanation thereof will not be repeated unless otherwise required.

Next, a manufacturing method of the semiconductor device SED described above will be described. The arrangement pattern of the trench gate electrode TGE and the trench emitter electrodes TEE differs from the arrangement pattern of the trench gate electrode TGE and the trench emitter electrode TEE in the semiconductor device SED shown in FIG. 3 and the like, and the semiconductor device SED is manufactured by substantially the same manufacturing method as manufacturing method of the semiconductor device SED described in the first embodiment.

In the above-described semiconductor device SED, as described in the first embodiment, the recess RCS that is recessed on a semiconductor substrate SUB from the first main surface toward the second main surface is formed, and a shared contact member CCN contacts the recess RCS.

Therefore, the contact area between the shared contact member CCN and the base diffusion layer BDR is widened, and the contact resistivity is reduced. As a result, carriers (holes) accumulated in an N-type region NSR and the like are efficiently discharged from the base diffusion layer BDR to the emitter electrode MEE via the shared contact member CCN. As a result, the time until turn-off is shortened, and it is possible to contribute to reduce of turn-off loss.

The semiconductor device and method of manufacturing the same described in the embodiments can be variously combined as needed. Dependencies of the claims according to this combination are also planned.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
a semiconductor substrate of a first conductivity type having a first main surface and a second main surface opposite to the first main surface;
a first trench formed on the semiconductor substrate;
a first trench emitter electrode embedded in the first trench via a first insulating film;
a first impurity region of a second conductivity type opposite to the first conductivity type formed in a first region in the semiconductor substrate and contacted with the first trench;
a recess formed on the semiconductor substrate and straddled between the first trench emitter electrode and the first impurity region, in plan view;
an interlayer insulating film formed on the first main surface; and
a first contact member penetrated through the interlayer insulating film and embedded in the interlayer insulating film and the recess, wherein
the recess includes:
a first portion formed in the first impurity region and has a first depth which is a depth from the first main surface;
a second portion formed in the first trench emitter electrode and has a second depth which is a depth from the first main surface; and
a third portion formed in the first insulating film and has a third depth which is a depth from the first main surface and located deeper than the first depth and the second depth.

2. The semiconductor device according to claim 1, wherein
the first contact member is contacted with the first trench emitter electrode on one side at the third portion, and is contacted with the first impurity region on other side at the third portion.

3. The semiconductor device according to claim 2, wherein the first contact member is contacted with the first impurity region on all of the other side of the third portion.

4. The semiconductor device according to claim 2, further comprising:
a second impurity region of the second conductivity type formed in the first region such that the second impurity region contacts with the first contact member, wherein
an impurity concentration of the second impurity region is higher than an impurity concentration of the first impurity region.

5. The semiconductor device according to claim 4, further comprising:
a third impurity region of the first conductivity type formed in the first region on the first impurity region such that the third impurity region exposes to the first main surface,
wherein the first contact member contacts with the third impurity region on the first main surface.

6. The semiconductor device according to claim 1, further comprising:

a second trench formed on the semiconductor substrate; and
a first trench gate electrode embedded in the second trench via a second insulating film, wherein
the first trench gate electrode is located separate apart from the first trench emitter electrode such that the first region is located between the first trench gate electrode and the first trench emitter electrode.

7. The semiconductor device according to claim 6, further comprising:
an emitter electrode formed on the first main surface and electrically connected to the first trench emitter electrode;
a gate electrode formed on the first main surface and electrically connected to the first trench gate electrode; and
a collector electrode formed on the second main surface, wherein
the emitter electrode, the gate electrode and the collector electrode configure an IGBT.

8. A semiconductor device comprising:
a semiconductor substrate of a first conductivity type having a first main surface;
a first trench, a second trench, a third trench and a fourth trench formed on the semiconductor substrate;
a first trench emitter electrode embedded in the first trench via a first insulating film;
a second trench emitter electrode embedded in the second trench via a second insulating film;
a first trench gate electrode embedded in the third trench via a third insulating film;
a second trench gate electrode embedded in the fourth trench via a fourth insulating film;
a first impurity region of a second conductivity type opposite to the first conductivity type formed in a first region in the semiconductor substrate and contacted with the first trench and the second trench;
a recess formed on the semiconductor substrate straddled between the first trench emitter electrode and the first impurity region, in plan view;
an interlayer insulating film formed on the semiconductor substrate such that the interlayer insulating film covers the first main surface; and
a first contact member penetrated through the interlayer insulating film and embedded in the interlayer insulating film and the recess, wherein
the second trench emitter electrode is located separate apart from the first trench emitter electrode such that the first region is located between the first trench emitter electrode and the second trench emitter electrode,
the second trench gate electrode is located separate apart from the first trench gate electrode such that a second region is located between the first trench gate electrode and the second trench gate electrode, and
the recess includes:
a first portion formed in the first impurity region and has a first depth which is a depth from the first main surface;
a second portion formed in the first trench emitter electrode and has a second depth which is a depth from the first main surface; and
a third portion formed in the first insulating film and has a third depth which is a depth from the first main surface and located deeper than the first depth and the second depth.

9. The semiconductor device according to claim 8, further comprising:

a third impurity region of the first conductivity type formed in the second region such that the third impurity region exposes to the first main surface, a fourth impurity region of the second conductivity type formed in the second region and located deeper than the third impurity region; and a second contact member penetrated through the inter-layer insulating film and embedded in a part of the second region, wherein the second contact member is contacted with the third impurity region and the fourth impurity region.

10. The semiconductor device according to claim 6, further comprising:

a third trench formed on the semiconductor substrate; and a second trench emitter electrode embedded in the third trench via a third insulating film, wherein the first trench emitter electrode, the first trench gate electrode, the second trench emitter electrode are located separate apart from each other such that the first trench gate electrode is located between the first trench emitter electrode and the second trench emitter electrode.

\* \* \* \* \*